United States Patent
Fujikura et al.

(10) Patent No.: US 12,129,572 B2
(45) Date of Patent: Oct. 29, 2024

(54) NITRIDE SEMICONDUCTOR TEMPLATE, METHOD FOR MANUFACTURING NITRIDE SEMICONDUCTOR TEMPLATE, AND METHOD FOR MANUFACTURING NITRIDE SEMICONDUCTOR FREE-STANDING SUBSTRATE

(71) Applicant: SUMITOMO CHEMICAL COMPANY, LIMITED, Tokyo (JP)

(72) Inventors: Hajime Fujikura, Ibaraki (JP); Taichiro Konno, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 1197 days.

(21) Appl. No.: 16/309,535

(22) PCT Filed: Jan. 24, 2017

(86) PCT No.: PCT/JP2017/002323
§ 371 (c)(1),
(2) Date: Dec. 13, 2018

(87) PCT Pub. No.: WO2017/216997
PCT Pub. Date: Dec. 21, 2017

(65) Prior Publication Data
US 2020/0127163 A1 Apr. 23, 2020

(30) Foreign Application Priority Data
Jun. 16, 2016 (JP) .................................. 2016-119576

(51) Int. Cl.
*H01L 33/12* (2010.01)
*C23C 16/34* (2006.01)
(Continued)

(52) U.S. Cl.
CPC ............ *C30B 29/406* (2013.01); *C23C 16/34* (2013.01); *C30B 25/183* (2013.01); *C30B 28/12* (2013.01);
(Continued)

(58) Field of Classification Search
CPC . H01L 21/205; H01L 33/007; H01L 33/0075; H01L 33/0093; H01L 33/12; H01L 33/32
See application file for complete search history.

(56) References Cited

U.S. PATENT DOCUMENTS

2003/0033974 A1* 2/2003 Ueda ................... H01L 21/0254
257/E21.119
2007/0249082 A1 10/2007 Hanaoka et al.
(Continued)

FOREIGN PATENT DOCUMENTS

CN 105648524 A * 6/2016
JP H08-133881 A 5/1996
(Continued)

OTHER PUBLICATIONS

Leach et al. "Large-area bow-free n+ GaN templates by HVPE for LEDs" Proc. of SPIE vol. 8986 898602-1; Published Mar. 8, 2014 (Year: 2014).*
(Continued)

*Primary Examiner* — Matthew C Landau
*Assistant Examiner* — Dmitriy Yemelyanov
(74) *Attorney, Agent, or Firm* — Pearne & Gordon LLP

(57) ABSTRACT

There is provided a nitride semiconductor template, including: a substrate having a front surface and a back surface opposite to the front surface; a back side semiconductor layer provided on a back surface side of the substrate, comprising a polycrystalline group III nitride semiconductor, and having a linear expansion coefficient different from a linear expansion coefficient of the substrate; and a front (Continued)

side semiconductor layer provided on a front surface side of the substrate, comprising a monocrystalline group III nitride semiconductor, and having a linear expansion coefficient different from a linear expansion coefficient of the substrate, wherein a thickness of the front side semiconductor layer is a thickness exceeding a critical thickness at which cracks are generated in the front side semiconductor layer when only the front side semiconductor layer is formed without forming the back side semiconductor layer.

19 Claims, 12 Drawing Sheets

(51) Int. Cl.

| | | |
|---|---|---|
| *C30B 25/18* | (2006.01) | |
| *C30B 28/12* | (2006.01) | |
| *C30B 29/40* | (2006.01) | |
| *H01L 21/02* | (2006.01) | |
| *H01L 33/00* | (2010.01) | |
| *H01L 33/32* | (2010.01) | |

(52) U.S. Cl.
CPC ...... *H01L 21/0242* (2013.01); *H01L 21/0243* (2013.01); *H01L 21/02433* (2013.01); *H01L 21/02458* (2013.01); *H01L 21/0254* (2013.01); *H01L 21/02609* (2013.01); *H01L 21/0262* (2013.01); *H01L 33/007* (2013.01); *H01L 33/12* (2013.01); *H01L 33/32* (2013.01)

(56) References Cited

U.S. PATENT DOCUMENTS

| | | | |
|---|---|---|---|
| 2011/0101502 A1* | 5/2011 | Wang | H01L 21/02664 257/E29.105 |
| 2011/0177638 A1 | 7/2011 | Romano et al. | |
| 2012/0258286 A1 | 10/2012 | Amano et al. | |
| 2013/0087807 A1 | 4/2013 | Ikuta et al. | |

FOREIGN PATENT DOCUMENTS

| | | | | |
|---|---|---|---|---|
| JP | 2003-113000 A | 4/2003 | | |
| JP | 2007-203420 A | 8/2007 | | |
| JP | 2013-517621 A | 5/2013 | | |
| WO | 2009001833 A1 | 12/2008 | | |
| WO | 2011077541 A1 | 6/2011 | | |
| WO | WO-2011086476 A1 * | 7/2011 | ....... | H01L 21/02381 |
| WO | 2011161975 A1 | 12/2011 | | |

OTHER PUBLICATIONS

Okada et al. ("Alternately double-sided growth of low-curvature GaN templates on sapphire substrates using hydride vapor phase epitaxy." Phys. Status Solidi B, 253: 819-823; Published Mar. 9, 2016 (Year: 2016).*

Fujikura et al. ("Fabrication of large flat gallium nitride templates with extremely low dislocation densities in the 106 cm-2 range by novel two-side hydride vapor-phase epitaxial growth"; Journal of Crystal Growth vol. 475, Oct. 1, 2017, pp. 208-215) (Year: 2017).*

Richter et al. ("Reactor and growth process optimization for growth of thick GaN layers on sapphire substrates by HVPE" Journal of Crystal Growth; vol. 277, Issues 1-4, Apr. 15, 2005, pp. 6-12). (Year: 2005).*

Fujito et al."High-quality nonpolar m-plane GaN substrates grown by HVPE" phys. stat. sol. (a) 205, No. 5, 1056-1059 (2008) (Year: 2008).*

S. C, Corekci (J Mater Sci "Characterization of an AIN buffer layer and a thick-GaN layer grown on sapphire substrate by MOCVD" 46:1606-1612 Published 2010) (Year: 2010).*

English Translation of the International Preliminary Report on Patentability and Written Opinion for PCT/JP2017/002323 (Date of Mailing: Dec. 27, 2018).

International Search Report for PCT/JP2017/002323 (Date of Mailing: Apr. 11, 2017).

Written Opinion for PCT/JP2017/002323 (Date of Mailing: Apr. 11, 2017).

Preble, Edward A., et al., "2"-4" diameter GaN-on-sapphire substrates free of wafer bow at all temperatures," Phys. Status Solidi C 11, Mar. 10, 2014, No. 3-4, 604-607 (2014).

Dong Wei, et al., "Simulation of Stresses in GaN Thin Film on Sapphire", Advances in Laser and Optoelectronics, vol. 50, No. 7, pp. 178-182, May 31, 2013, School Of Energy and Power Engineering, Jiangsu University, Zhenjiang, Jiangsu 212013, China; English abstract included.

Chinese Office Action issued in Chinese Patent Application No. 201780037496.1 dated Jul. 8, 2020.

* cited by examiner

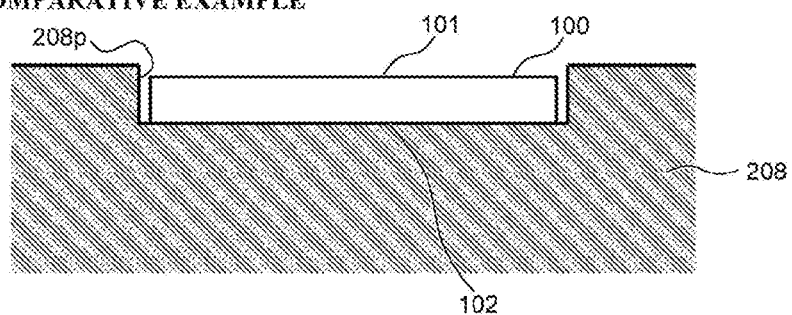
FIG.3A COMPARATIVE EXAMPLE
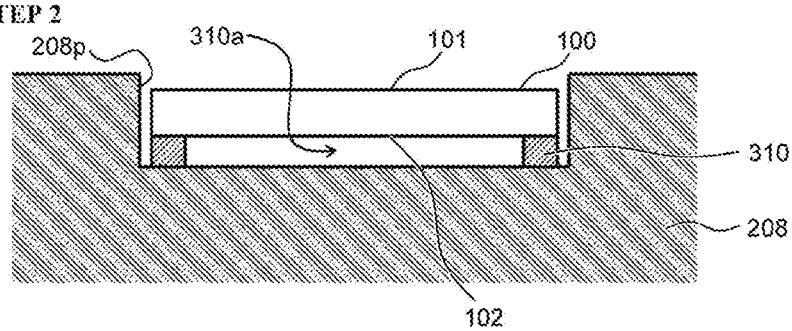
FIG.3B STEP 2
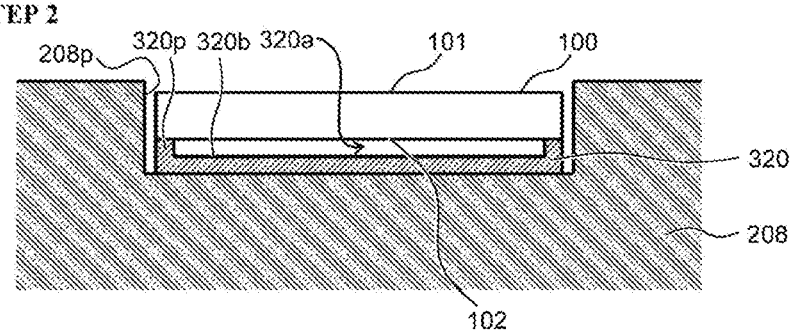
FIG.3C STEP 2

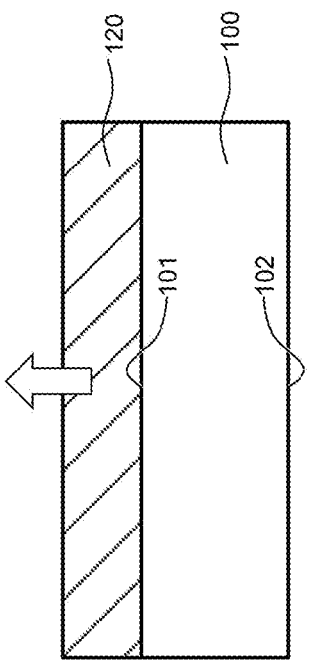
FIG.4A  STEP 2 (GROWTH TEMPERATURE)
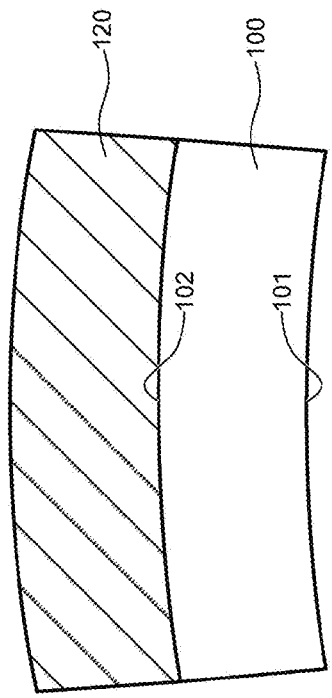
FIG.4B  STEP 2 (ROOM TEMPERATURE)

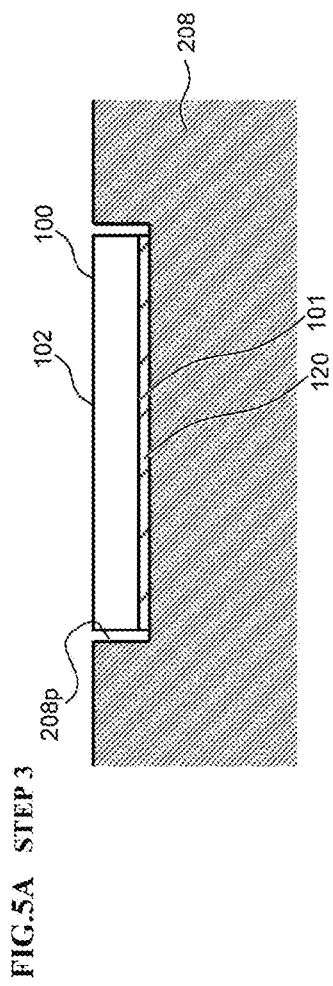
FIG.5A STEP 3
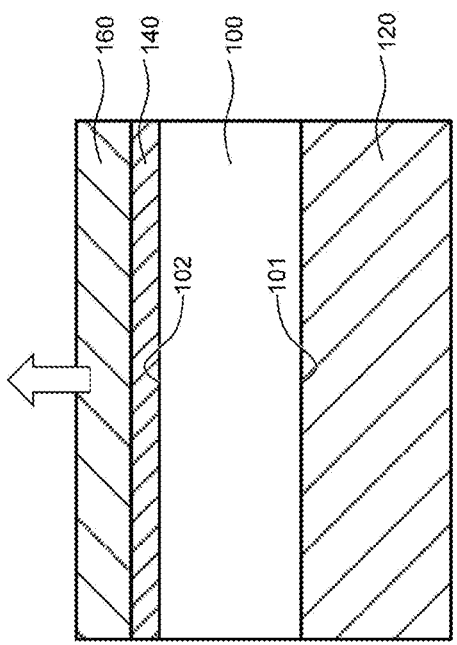
FIG.5B STEP 3 (GROWTH TEMPERATURE)

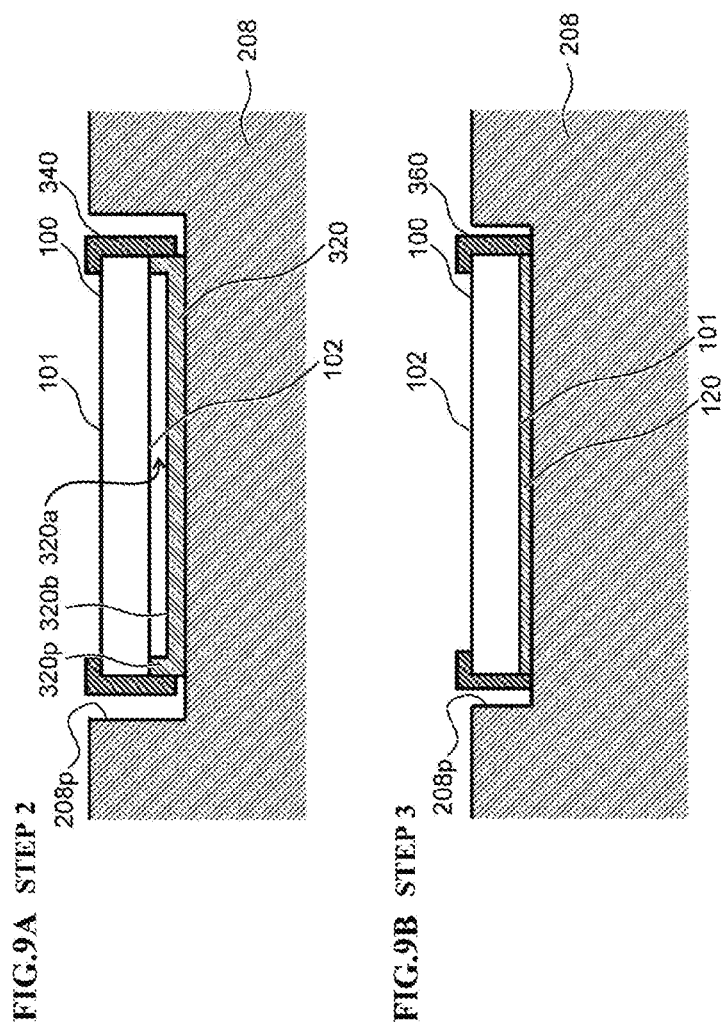

NITRIDE SEMICONDUCTOR TEMPLATE, METHOD FOR MANUFACTURING NITRIDE SEMICONDUCTOR TEMPLATE, AND METHOD FOR MANUFACTURING NITRIDE SEMICONDUCTOR FREE-STANDING SUBSTRATE

TECHNICAL FIELD

The present invention relates to a nitride semiconductor template, a method for manufacturing a nitride semiconductor template and a method for manufacturing a semiconductor free-standing substrate.

DESCRIPTION OF RELATED ART

When manufacturing a semiconductor device such as a light-emitting device composed of a group III nitride semiconductor, for example, a nitride semiconductor template in which a nitride semiconductor layer is grown on a surface of a sapphire substrate or the like is sometimes used as a substrate for growing a laminate such as a light-emitting layer (see, for example, Patent Document 1, Non-Patent Document 1).

PRIOR ART DOCUMENT

Patent Document

[Patent Document 1] Japanese Unexamined Patent Publication No. 2016-32038

Non-Patent Document

Non-Patent Document Edward A. P. Preble, Jacob H. Leach, Robert Metzger, Eugene Shishkin, and Kevin A. Udwary: Phys. Status Solidi C 11, No. 3-4 604-607 (2014)

SUMMARY OF THE INVENTION

Problem to be Solved by the Invention

An object of the present invention is to provide a technique of obtaining a high-quality nitride semiconductor template or a nitride semiconductor free-standing substrate with high yield.

Means for Solving the Problem

According to an aspect of the present invention, there is provided a nitride semiconductor template, including:
  a substrate having a front surface and a back surface opposite to the front surface;
  a back side semiconductor layer provided on a back surface side of the substrate, comprising a polycrystalline group III nitride semiconductor, and having a linear expansion coefficient different from a linear expansion coefficient of the substrate; and
  a front side semiconductor layer provided on a front surface side of the substrate, comprising a monocrystalline group III nitride semiconductor, and having a linear expansion coefficient. different from a linear expansion coefficient of the substrate,
  wherein a thickness of the front side semiconductor layer is a thickness exceeding a critical thickness at which cracks are generated in the front side semiconductor layer in a case that only the front side semiconductor layex is formed without forming the back side semiconductor layer.

According to another aspect of the present invention, there is provided a method for manufacturing a nitride semiconductor template, including:
  a first step of preparing a substrate having a front surface and a back surface opposite to the front surface;
  a second step of forming a back side semiconductor layer provided on a back surface side of the substrate, comprising a polycrystalline or amorphous group III nitride semiconductor, and having a linear expansion coefficient different from a linear expansion coefficient of the substrate; and
  a third step of forming a front side semiconductor layer on the front surface side of the substrate, comprising a monocrystalline group III nitride semiconductor, and having a linear expansion coefficient different from a linear expansion coefficient of the substrate,
  wherein the third step is performed after the second step.

According to further another aspect of the present invention, there is provided a method for manufacturing a nitride semiconductor free-standing substrate, including:
  a first step of preparing a substrate having a front surface and a back surface opposite to the front surface;
  a second step of forming a back side semiconductor layer provided on a back surface side of the substrate, comprising a polycrystalline or amorphous group III nitride semiconductor, and having a linear expansion coefficient different from a linear expansion coefficient of the substrate;
  a third step of forming a nitride semiconductor template by forming a front side semiconductor layer on the front surface side of the substrate, comprising a monocrystalline group III nitride semiconductor, and having a linear expansion coefficient different from a linear expansion coefficient of the substrate; and
  a fourth step of removing the back side semiconductor layer and the substrate from the nitride semiconductor template to leave the front side semiconductor layer,
  wherein the third step is performed after the second step.

Advantage of the Invention

According to the present invention, a high-quality nitride semiconductor template or a high-quality nitride semiconductor free-standing substrate can be obtained with high yield.

BRIEF DESCRIPTION OF THE DRAWINGS

FIG. 3A is a cross-sectional view showing a placement state of a substrate according to a comparative example, FIG. 3B and FIG. 3C are cross-sectional views showing a placement state of the substrate in step 2.

FIG. 4A is a cross-cross-sectional view showing a state of a substrate when forming a back side semiconductor layer at a predetermined growth temperature in step 2, FIG. 4B is a cross-sectional view showing a state of the substrate when a substrate temperature is lowered to room temperature after forming the back side semiconductor layer in step 2.

FIG. 5A is a cross-sectional view showing a placement state of the substrate in step 3, and FIG. 5B is a cross-sectional view showing a state of the substrate when forming the front side semiconductor layer at a predetermined growth temperature in step 3.

FIG. 9A is a cross-sectional view showing a placement state of the substrate in step 2 of the modified example 4, and FIG. 9B is a cross-sectional view showing a placement state of the substrate in step 3 of the modified example 4.

DETAILED DESCRIPTION OF THE INVENTION

<Finding Obtained by Inventors>

Figure 1:
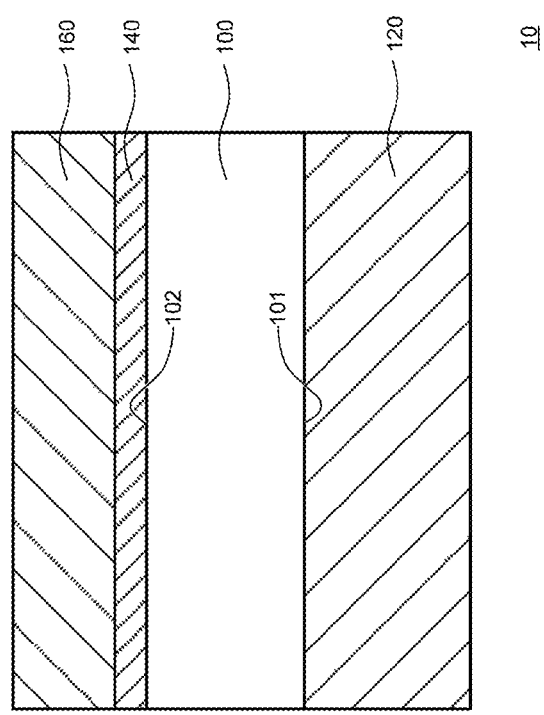
FIG. 1 is a cross-sectional view showing a nitride semiconductor template according to an embodiment of the present invention.

In a conventional nitride semiconductor template, a nitride semiconductor layer made of a group III nitride semiconductor is provided only on a front surface side of a substrate such as a sapphire substrate. In such a configuration, when a thickness of a nitride semiconductor layer is increased, there is a possibility that the nitride semiconductor template would be warped in airily due to a difference in linear expansion coefficient between the group III nitride semiconductor and the substrate. Specifically, there is a possibility that the nitride semiconductor template would be warped so that the nitride semiconductor layer side has a convex shape, when the temperature of the nitride semiconductor template is lowered after the nitride semiconductor layer is formed, from a growth temperature (typically about 900 to 1200° C.) to room temperature, because the linear expansion coefficient of the sapphire substrate is larger than the linear expansion coefficient of the group III nitride semiconductor. When warping occurs in the nitride semiconductor template, a focal deviation occurs between a central portion and a peripheral edge portion of the nitride semiconductor template and there is a possibility that pattern defects may occur, when performing photolithography in a process of manufacturing a semiconductor device such as a light-emitting device. Further, when the thickness of the nitride semiconductor layer is increased, internal stress is accumulated in each of the nitride semiconductor layer and the substrate, and there is a possibility that cracks are generated in either or both of them. When the cracks are generated in the substrate, the substrate cannot be applied to the manufacture of the semiconductor device such as the light-emitting device. As described above, in the conventional nitride semiconductor template, there is a possibility that a yield is lowered due to warping or cracks.

In order to solve such a problem, for example Non-Patent document 1 is disclosed. In the method for manufacturing a nitride semiconductor template in Non-Patent. Document 1, a monocrystalline gallium nitride (GaN) layer is formed first on a front surface side of the sapphire substrate, and a polycrystalline GaN layer is formed next as a stress balance layer on a back surface side of the sapphire substrate. Thereafter, the GaN layer on the front surface side of the sapphire substrate is polished. Thereby, warping of the nitride semiconductor template is reduced.

However, in Non-Patent, Document 1, a monocrystalline GaN layer is formed on the front surface side of the sapphire substrate in a state in which no stress balance layer is provided on the back surface side of the sapphire substrate, and therefore when the monocrystalline GaN layer is formed thick on the front surface side of the sapphire substrate, there is a possibility that internal stress is accumulated in the GaN layer on the front side and cracks are generated. Specifically, according to the investigation by the inventors of the present invention, it is found that, in a case that the thickness of the GaN layer en the front: surface side is more than 10 µm, cracks are generated in the GaN layer on the front side, when the temperature of the nitride semiconductor template having only the GaN layer on the front side is raised to the growth temperature of the group nitride semiconductor (For example, when firming the GaN layer on the back side after forming the GaN layer on the front: side as in Non-Patent Document 1). It is also found that, in a case that the thickness of the GaN layer on the front side is more than 15 µm, cracks are sometimes generated in the GaN layer on the front side after elapse of a predetermined time from formation of the GaN layer on the front side. It is also found that, in a case that the thickness of the GaN layer on the front side is more than 20 µm, cracks are sometimes generated in the GaN layer on the front surface side immediately after the formation of the GaN layer on the front surface side. Due to such a phenomenon, according to the method of Non-Patent Document 1, it is difficult to stably manufacture the nitride semiconductor template in which the monocrystalline GaN layer is formed thick on the front surface side of the sapphire substrate.

Further, in Non-Patent Document 1, as described above, the thickness of the GaN layer on the front surface side cannot: be more than 20 µm, and therefore there is a possibility that a dislocation density of the GaN layer on the front surface side cannot be lowered to a predetermined value or less (for example, $5 \times 10^7$ cm$^{-2}$ or less which will described later).

Further, in Non-Patent Document 1, after forming the monocrystalline GaN layer on the front surface side of the sapphire substrate, the sapphire substrate is placed on a susceptor so that the GaN layer side on the front surface side is in contact with the surface of the susceptor, and a stress balance layer is formed on the back surface side of the sapphire substrate by heat transfer from the susceptor. At this time, there is a possibility that the heat transferred directly from the susceptor to the GaN layer on the front side causes the GaN layer on the front surface side to be thermally etched, and the surface becomes rough. Therefore, it is necessary to perform a step of polishing the GaN layer on the front side after forming the stress balance layer on the back side, and therefore a manufacturing cost is likely to increase.

The present invention is based on the above finding obtained by the inventors of the present invention.

An Embodiment of the Present Invention

An embodiment of the present invention will described hereafter, with reference to the drawings.
(1) Nitride Semiconductor Template First, a nitride semiconductor template of this embodiment will be described, using FIG. 1. FIG. 1 is a cross-sectional view showing the nitride semiconductor template of this embodiment.

A nitride semiconductor template 10 is configured as a substrate-like structure used as a base material in manufacturing a semiconductor device such as a light-emitting device. Specifically, the nitride semiconductor template 10 includes a substrate 100, a back side semiconductor layer (first semiconductor layer) 120, a buffer layer 140, and a front side semiconductor layer (second semiconductor layer) 160.
(Substrate)

The substrate 100 is configured to function as a supporting substrate for supporting the back side semiconductor layer 120 and the front side semiconductor layer 160. Hereinafter, a lower surface of the substrate 100 is referred to as a "back surface (first main surface) 101", and an upper surface opposite to the lower surface of the substrate 100 is defined as "front surface (second main surface) 102".

The substrate 100 is, for example, a sapphire ($Al_2O_3$) substrate. Further, the front surface 102 of the substrate 100 is (0001) plane (c plane), or a plane inclined from c plane in M axis or A axis direction of the sapphire crystal axis in a range of 0.1 to 2°. Further, a thickness of the substrate 100 depends on a diameter of the substrate 100, but is, for example, 300 μm or more and 2 mm or less. Typically when the diameter of the substrate 100 is 2 inches (50.8 mm), the thickness of the substrate 100 is 300 to 450 μm, and when the diameter of the substrate 100 is 4 inches (100 mm), the thickness of the substrate 100 is 600 to 900 μm, and when the diameter of the substrate 100 is 6 inches (150 mm), the thickness of the substrate 100 is 1000 to 2000 μm. Here, for example, the diameter of the substrate 100 is 4 inches, and the thickness of the substrate 100 is 900 μm.

The front surface 102 of the substrate 100 is, for example, a mirror surface. In other words, the front surface 102 of the substrate 100 is a so-called an epi-ready surface on which the group III nitride semiconductor can be epitaxially grown. Specifically, root mean square roughness (RMS) of the front surface 102 of the substrate 100 is, for example, 10 nm or less, preferably 1 nm or less. "RMS" as used herein means RMS in a case of measuring a 20 μm square area using an atomic force microscope (AFM). Meanwhile, the back surface 101 of the substrate 100 is, for example, a rough surface having random irregularities, a so-called lap surface. Namely, surface roughness on the back surface 101 of the substrate 100 is larger than the surface roughness on the front surface 102 of the substrate 100. Specifically, the RMS on the back surface 101 of the substrate 100 is for example 0.5 μm or more and 5 μm or less. Thereby, it is easy to grow a monocrystalline group nitride semiconductor on the front surface 102 side of the substrate 100 while making it easy to grow the polycrystalline group III nitride semiconductor on the back surface 101 side of the substrate 100.
(Back Side Semiconductor Layer)

The back side semiconductor layer 120 is provided on the back surface 101 side of the substrate 100, and is configured so that internal stress generated in the back side semiconductor layer 120 and internal stress generated in the front side semiconductor layer 160 cancel each other. Thereby, it is possible to reduce warping of the nitride semiconductor template 10 and suppress the generation of cracks in the nitride semiconductor template 10.

The back side semiconductor layer 120 comprises, for example, the polycrystalline group III nitride semiconductor, and has a linear expansion coefficient different from the linear expansion coefficient of the substrate 100. In this embodiment, for example, the back side semiconductor layer 120 comprises polycrystalline GaN. There is almost no report on the linear expansion coefficient of the polycrystalline GaN, and its linear expansion coefficient is unclear. However, judging from the results of examples described later, it can be considered that the linear expansion coefficient of the polycrystalline GaN is smaller than the linear expansion coefficient: ($7.00 \times 10^{-6}$/K) in the a-axis direction of the sapphire substrate which is the substrate 100, and is close to the linear expansion coefficient of the monocrystalline GaN ($5.59 \times 10^{-6}$/K).

For example, the back side semiconductor layer 120 is directly provided on the back surface 101 of the substrate 100 as a rough surface without interposing a so-called buffer layer (in contact with the back surface 101). Therefore, the back side semiconductor layer 120 is formed as being polycrystalline without epitaxial growth as being monocrystalline.

In this embodiment, since the back side semiconductor layer 120 comprises a polycrystalline group III nitride semiconductor, and therefore a crystal orientation in the back side semiconductor layer 120 is random, that is, a cleavage direction is random. Thereby, generation of the cracks in a specific cleavage direction in the back side semiconductor layer 120 can be suppressed. Further, even if the internal stress occurs in the back side semiconductor layer 120, cleavage property is low, and therefore the internal stress can be isotropically dispersed. As a result, even when the back side semiconductor layer 120 is formed thick, it is possible to make the back side semiconductor layer 120 hard to break.

Further, in this embodiment, since the back side semiconductor layer 120 comprises the polycrystalline group III nitride semiconductor, visibility and heat absorption of the nitride semiconductor template 10 can be improved. The monocrystalline group III nitride semiconductor has a wide band gap, and therefore transmittance of light particularly in a visible region is high, and is colorless and transparent. However, in this embodiment, since the back side semiconductor layer 120 comprises the polycrystalline group III nitride semiconductor, light absorption due to crystal defects is large in the hack side semiconductor layer 120. Therefore, the back side semiconductor layer 120 has low light transmittance from the visible region to an infrared region, and is opaque. Since the back side semiconductor layer 120 is opaque, the visibility of the nitride semiconductor template 10 can be improved. Further, since the transmittance of the back side semiconductor layer 120 in the infrared region is low, a heat absorption rate of the nitride semiconductor template 10 can be improved.

Further, in this embodiment, the thickness of the back side semiconductor layer 120 is a thickness so that the internal stress of the back side semiconductor layer 120 and the internal stress of the front side semiconductor layer 160 are substantially equal to each other, and a thickness so that a warping amount of the nitride semiconductor template 10 is within ±200 μm over a range from the room temperature to the growth temperature of the front side semiconductor layer 160. The front side semiconductor layer 160 is formed as being monocrystalline as described later, and therefore the warping stress of the front side semiconductor layer 160 is stronger than that of the polycrystalline back side semiconductor layer 120. Accordingly, in this embodiment, for example, it is preferable that the thickness of the back side semiconductor layer 120 be equal to or more than the thickness of the front side semiconductor layer 160 described later. Thereby; the internal stress of the back side semiconductor layer 120 and the internal stress of the front side semiconductor layer 160 can be sufficiently canceled each other so that the warping of the substrate 100 is reduced.

Specifically, the ratio of the thickness of the back side semiconductor layer 120 to the thickness of the front side semiconductor layer 160, which will be described later, is preferably 1.0 times or more and 1.5 times or less. As to how to set the thickness of the back side semiconductor layer 120 with respect to the specific thickness of the front side semiconductor layer 160, some discussion is necessary. Stress (warping amount) generated between the substrate 100 and the polycrystalline back side semiconductor layer 120 is likely to be determined only by the thickness of the back side semiconductor layer 120, regardless of a growth condition of the back side semiconductor layer 120. Meanwhile situation is different between the monocrystalline front side semiconductor layer 160 and the back side semiconductor layer 120. Even when the thickness of the front side semiconductor layer 160 finally becomes the same as the thickness of the back side semiconductor layer 120, for example, when a growth rate at an initial stage of a growth of the front side semiconductor layer 160 is different (namely, when the initial nucleation density is different), or when the timing of changing the growth condition is different in order to flatten the surface of the front side semiconductor layer 160, the warping of the substrate 100 finally obtained is likely to be largely different. However, even when such an influence of growth conditions occurs, or even when the size and the thickness of the substrate 100 are changed within the above-described range, it is possible to adjust the final warping amount to ±200 μm or less, by setting the ratio of the thickness of the back side semiconductor layer 120 to the thickness of the front side semiconductor layer 160 to 1.0 times or more and 1.5 times or less.

Here, the thickness of the back side semiconductor layer 120 is, for example, more than 20 μm. If the thickness of the back side semiconductor layer 120 is 20 μm or less, there is a possibility that the nitride semiconductor template 10 is warped largely in a case that the thickness of the front side semiconductor layer 160 is more than 20 μm. In contrast, by making the thickness of the back side semiconductor layer 120 more than 20 μm, the warping amount of the nitride semiconductor template 10 can be suppressed to a small range, even when the thickness of the front side semiconductor layer 160 is inure than 20 μm. It is more preferable that the thickness of the back side semiconductor layer 120 is, for example, 50 μm or more. Thereby it is possible to further improve the visibility and the heat absorption rate of the nitride semiconductor template 10. An upper limit value of the thickness of the back side semiconductor layer 120 is set according to the thickness of the front side semiconductor layer 160. However, the thickness of the back side semiconductor layer 120 is preferably, for example, 200 μm or less, from a viewpoint of suppressing an excessive increase in the material for forming the back side semiconductor layer 120.

In this embodiment, for example, the thickness of the back side semiconductor layer 120 is made substantially uniform within the back surface 101 of the substrate 100. Thereby, the internal stress generated in the back side semiconductor layer 120 can be made uniform in the surface.

(Buffer Layer)

The buffer layer 140 is provided on the front surface 102 of the substrate 100, and configured to enhance the crystal orientation of the front side semiconductor layer 160 described later, and to buffer a lattice constant difference between the substrate 100 and the front side semiconductor layer 160. The buffer layer 140 comprises, for example, the group III nitride semiconductor, and for example in this embodiment, the buffer layer 140 comprises aluminum nitride (AlN).

The thickness of the buffer layer 140 is, for example, 10 nm or more and 400 nm or less.

(Front Side Semiconductor Layer)

The front side semiconductor layer 160 is provided on the front surface 102 side of the substrate 100, and is configured to function as a growth underlayer of a laminate such as a light-emitting layer grown on the front side semiconductor layer 160.

The front side semiconductor layer 160 comprises, for example, a monocrystalline group III nitride semiconductor, and has a linear expansion coefficient different, from the linear expansion coefficient of the substrate 100. In this embodiment, for example, the front side semiconductor layer 160 comprises monocrystalline GaN, and a surface (upper surface) thereof is a (0001) plane (c plane). Further, the linear expansion coefficient of the front side semiconductor layer 160 in the a-axis direction (the direction along the front surface 102 of the substrate 100) is smaller than the linear expansion coefficient ($7.00 \times 10^{-6}$/K) in the a-axis direction of the sapphire substrate which is the substrate 100, and is $5.59 \times 10^{-6}$/K.

The front side semiconductor layer 160 is provided on the front surface 102 side of the substrate 100 interposing the above-described buffer layer 140. Thereby, the front side semiconductor layer 160 is formed as being monocrystal line by epitaxial growth on the buffer layer 110.

Here, in the nitride semiconductor template when only the front side semiconductor layer 160 is formed without forming the back side semiconductor layer 120, as described above, as the thickness of the front side semiconductor layer 160 is increased, the internal stress is accumulated in the front side semiconductor layer 160, and cracks are sometimes generated depending on various situations.

In contrast, in this embodiment, as described above, since the back side semiconductor layer 120 is provided on the back surface 101 side of the substrate 100, the thickness of the front side semiconductor layer 160 can be increased (thickened) while suppressing warping and cracks of the nitride semiconductor template 10. As a result, dislocation density on the front surface of the front side semiconductor layer 160 can be lowered. This is because dislocation in the semiconductor layer is likely to occur at a boundary where crystal nuclei as starting points of growth are bonded to each other. Namely, the narrower a space between crystal nuclei is, the higher the dislocation density becomes. Meanwhile, the wider a space between crystal nuclei is, the lower the dislocation density becomes. However, when the semiconductor layer is grown under a condition that the space between crystal nuclei becomes wider, the growth of the front side semiconductor layer 160 is stopped before the crystal nuclei are sufficiently bonded (in the middle of a three-dimensional growth of the crystal nuclei) unless the semiconductor layer is grown to a predetermined thickness or more, and therefore there is a possibility that the front surface of the front side semiconductor layer 160 becomes rough. Therefore, in this embodiment, by increasing the thickness of the front side semiconductor layer 160, it is possible to adopt a condition that the space between the crystal nuclei is widened. Then even when this condition is adopted, the crystal nuclei can be securely bonded to each other and the front surface of the front side semiconductor layer 160 can be smoothed. As a result, the dislocation density of the front side semiconductor layer 160 can be lowered. Further, even after the front surface of the semiconductor layer is flattened, it is effective to grow the semiconductor layer thicker further thereon, for further reducing the dislocation density. This is because the following process occurs at a certain rate. Even if the surface during growth of the semiconductor layer is flat, the position of the dislocation moves on the surface of semiconductor layer like a random walk as the semiconductor layer grows. Therefore, dislocations meet each other, or a dislocation loop is formed. As a result the dislocations that reach the surface of the semiconductor layer are reduced. Also from this viewpoint, the dislocation density of the front side semiconductor layer 160 can be lowered by increasing the thickness of the it side semiconductor layer 160.

In this embodiment, the thickness of the front side semiconductor layer 160 can be for example a thickness exceeding a critical thickness at which cracks are generated in the front side semiconductor layer 160, in a case that only the front side semiconductor layer 160 is formed without forming the back side semiconductor layer 120.

The above-described critical thickness is classified into a first critical thickness, a second critical thickness, and a third critical thickness in order from the smaller, depending on a crack generation situation.

The first critical thickness is for example a thickness at which cracks are generated in the front side semiconductor layer 160, when the nitride semiconductor template is heated to the growth temperature of the group III nitride semiconductor (for example, 1000° C. or more and 1100° C. or less), in a case that only the front side semiconductor layer 160 is formed without forming the back side semiconductor layer 120. Specifically, the first critical thickness is for example 10 μm.

The second critical thickness is for example a thickness at which cracks are generated in the front side semiconductor layer 160 after elapse of a predetermined time (for example, 24 hours) from formation of the front side semiconductor layer 160, in a case that only the front side semiconductor layer 160 is formed without forming the back side semiconductor layer 120. Specifically, the second critical thickness is, for example, 15 μm.

The third critical thickness is for example a thickness at which cracks are generated in the front side semiconductor layer 160 immediately after formation of the front side semiconductor layer 160, in a case that only the front side semiconductor layer 160 is formed without: forming the back side semiconductor layer 120. Specifically, the third critical thickness is, for example, 20 μm.

Here, the thickness of the front side semiconductor layer 160 is, for example, a thickness exceeding the above-described third critical thickness, that is, more than 20 μm. If the thickness of the front side semiconductor layer 160 is 20 μm or less, it is impossible to adopt the condition that the space between the crystal nuclei becomes wide when forming the front side semiconductor layer 160, and there is a possibility that the dislocation density of the front side semiconductor layer 160 cannot be sufficiently lowered. In contrast, by making the thickness of the front side semiconductor layer 160 more than 20 μm, it is possible to adopt a condition that the space between the crystal nuclei becomes wider when forming the front side semiconductor layer 160, and further it is possible to fully utilize a process in which the dislocation is lowered due to growth after the front surface of the front side semiconductor layer 160 is flattened. As a result, the dislocation density of the front side semiconductor layer 160 can be $5 \times 10^7$ cm$^{-2}$ or less. Further, the thickness of the front side semiconductor layer 160 is more preferably 50 μm or more, for example. Thereby, the dislocation density of the front side semiconductor layer 160 can be less than $1 \times 10^7$ cm$^{-2}$. Note that an upper limit value of the thickness of the front side semiconductor layer 160 is set according to the thickness of the back side semiconductor layer 120, but from a viewpoint, of suppressing an excessive increase in the material for forming the front side semiconductor layer 160, the thickness of the front side semiconductor layer 160 is preferably, for example, 180 μm or less.

By making the thickness of the front side semiconductor layer 160 exceed the above-described third critical thickness, as described above, the dislocation density (average dislocation density) on the front surface of the front side semiconductor layer 160 is, for example, $5 \times 10^7$ cm$^{-2}$ or less, preferably less than $1 \times 10^7$ cm$^{-2}$. Namely, in the nitride semiconductor template 10 using a substrate 100 such as the sapphire substrate, it is possible to realize a low dislocation density equivalent to that of a free-standing substrate comprising only the group III nitride semiconductor. By using the front side semiconductor layer 160 having such a low dislocation density as a growth underlayer, semiconductor layer with good crystallinity can be grown on the front side semiconductor layer 160. The lower the dislocation density on the front surface of the front side semiconductor layer 160 is, the better it is, so a lower limit value thereof is not limited. However, if considering the upper limit value (180 μm) of the thickness of the front side semiconductor layer 160, the lower limit value of the dislocation density on the front surface of the front side semiconductor layer 160 is, for example, about the dislocation density when the thickness of the front side semiconductor layer 160 is the upper limit value, that is, it is about a front half of $10^6$ cm$^{-2}$.

The surface roughness (RMS) on the front surface of the front side semiconductor layer 160 is, for example, 2 nm or less in as-grown state (a state in which no polishing or the like is performed) of the front side semiconductor layer 160. Note that "RMS" as used herein means RMS when measuring a 20 μm square area by AFM in the same manner as described above. In this embodiment, as described later, the front side semiconductor layer 160 is formed after forming the back side semiconductor layer 120. Therefore, the front side semiconductor layer 160 is not damaged by thermal etching or the like, and the surface roughness of the front side semiconductor layer 160 can be kept small like the above value. Thereby, the semiconductor layer with good crystallinity can be grown on the front side semiconductor layer 160, by using the front side semiconductor layer 160 having a low surface roughness as a growth underlayer. The lower the surface roughness RMS on the front surface of the front side semiconductor layer 160 is, the better it is, so a lower limit value thereof is not limited. However, the surface roughness RIMS on the front surface of the front side semiconductor layer 160 is typically 0.2 nm or more, from a viewpoint that it is difficult to make the surface roughness on the front surface of the front side semiconductor layer 160 less than the surface roughness on the front surface 102 of the substrate 100.

The warping amount of the nitride semiconductor template 10 having the above-described configuration, is for example, within ±200 μm at room temperature (25° C.), more preferably within ±100 μm. The "warping amount of the nitride semiconductor template 10" called here, is defined as a difference between a local maximum value and a local minimum value of a height of the nitride semiconductor template 10, and for example, is defined as a difference between a height of the center portion and a height of the peripheral edge portion of the nitride semiconductor template 10. Further, a positive warping means a case that the front surface 102 side of the substrate 100 is convex, and a minus warping means a case that the front surface 102 side of the substrate 100 is concave. By reducing the warping amount of the nitride semiconductor template 10 in this way, occurrence of the focal deviation can be suppressed when photolithography is performed in a manufacturing process of a semiconductor device such as a light-emitting device using the nitride semiconductor template 10.

Further, the warping amount of the nitride semiconductor template 10 is, for example, within ±200 μm, and more preferably within ±100 μm, over a range of at least at room temperature (25° C.) or higher and growth temperature of the front side semiconductor layer 160 (for example, 1000° C.) or lower. Thereby, even when the semiconductor layer is grown on the front side semiconductor layer 160 using the front side semiconductor layer 160 as a growth underlayer, warping of the nitride semiconductor template 10 can be suppressed. For example, when manufacturing the light-emitting device, the light-emitting layer is sometimes formed at a temperature (for example, 700° C.) lower than the growth temperature of the front side semiconductor layer 160. In this case, the light-emitting layer is formed at, a temperature lower than the growth temperature of the front side semiconductor layer 160, and the internal stress is sometimes generated in the front side semiconductor layer 160. However, even in a case that the light-emitting layer is formed at a temperature lower than the growth temperature of the front side semiconductor layer 160, the warping of the nitride semiconductor template 10 can be suppressed to a small range, by canceling the internal stress of the front side semiconductor layer 160 by the internal stress of the back side semiconductor layer 120. As a result, it is possible to stably form the light-emitting layer.

(2) Method for Manufacturing a Nitride Semiconductor Template

Figure 2:
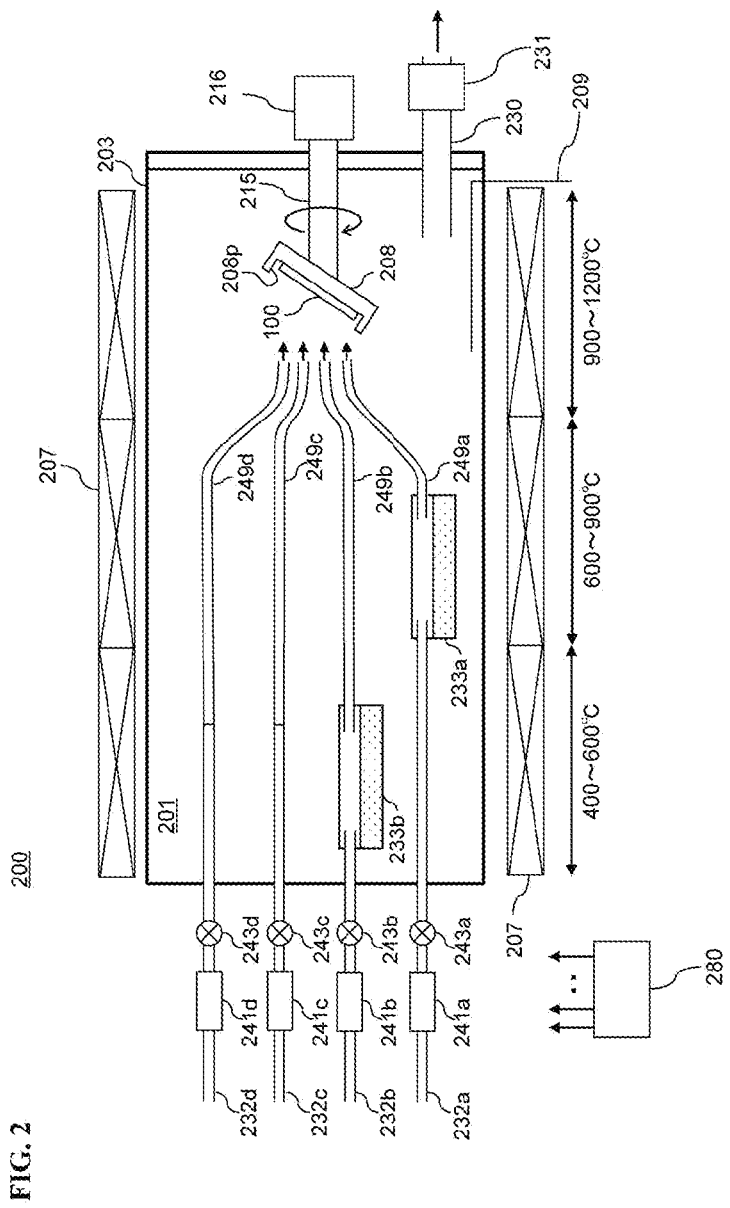
FIG. 2 is a schematic configuration view showing a nitride semiconductor template manufacturing device.

Next, a method for manufacturing a nitride semiconductor template according to this embodiment will be described with reference to FIGS. 1 to 4. FIG. 2 is a schematic configuration view showing a nitride semiconductor template manufacturing device, FIG. 3A is a cross-sectional view showing a placement state of a substrate according to a comparative example, FIG. 3B and FIG. 3C are cross-sectional views showing a placement state of the substrate in step 2. FIG. 4A is a cross-cross-sectional view showing a state of a substrate when forming a back side semiconductor layer at a predetermined growth temperature in step 2, FIG. 4B is a cross-sectional view showing a state of the substrate when a substrate temperature is lowered to room temperature after forming the back side semiconductor layer in step 2. FIG. 5A is a cross-sectional view showing a placement state of the substrate in step 3, and FIG. 5B is a cross-sectional view showing a nitride semiconductor template according to a modified example 1 of an embodiment of the present invention.

In this embodiment, explanation will be given for an example of manufacturing the nitride semiconductor template 10 by executing step 1 to step 3 shown below.

(Step 1: Substrate Preparing Step)

First, a substrate 100 is prepared. Specifically, for example, a sapphire substrate having a front surface 102, which is (0001) plane, is prepared as the substrate 100. Further, the front surface 102 of the substrate 100 is a mirror surface and the back surface 101 of the substrate 100 is a rough surface having random irregularities.

(Step 2: Back Side Semiconductor Layer Forming Step)

Next, in step 2, for example, a back side semiconductor layer 120 comprises a polycrystalline group III nitride semiconductor is formed, by using a hydride vapor phase epitaxy device (HVPE apparatus) 200 as a nitride semiconductor template manufacturing device shown in FIG. 2, and by supplying a predetermined film forming gas to the back surface 101 side of the substrate 100. The term "film forming gas" called here means a source gas for growing the group III nitride semiconductor, including hydrogen chloride (HCl) gas as a reaction gas for producing a group III source gas, ammonia ($NH_3$) gas, and carrier gases such as hydrogen ($H_2$) gas and nitrogen ($N_2$) gas.

The HVPE apparatus 200 is made of a heat-resistant material such as quartz, and includes an airtight container 203 in which a film formation chamber 201 is formed. In the film formation chamber 201, a susceptor 208 for holding the substrate 100 is provided. The susceptor 208 has a pocket 208p for housing the substrate 100 with a main surface of the substrate 100 facing upward. The susceptor 208 is connected to a rotating shaft 215 of a rotating mechanism 216, and is configured to be able to rotate the substrate 100 placed on the susceptor 208 in a circumferential direction (a direction along the main surface) while keeping the substrate 100 upward by a gear provided on the back surface of the susceptor 208. A gas supply pipe 232a for supplying HCl gas into the film formation chamber 201, a gas supply pipe 232b for supplying HCl gas into the film formation chamber 201, a gas supply pipe 232c for supplying $NH_3$ gas into the film formation chamber 201, and a gas supply pipe 232d for supplying $H_2$ gas and nitrogen ($N_2$) gas into the film formation chamber 201, are connected to one end of the airtight container 203. Flow rate controllers 241a to 241d, and valves 243a to 243d, are respectively provided on the gas supply pipes 232a to 232d, sequentially from an upstream side. A gas generator 233a is provided on a downstream of the gas supply pipe 232a, for containing a gallium (Ga) melt as a raw material. A nozzle 249a is connected to the gas generator 233a, for supplying gallium chloride (GaCl) gas as a film forming gas generated by the reaction of the HCl gas and the Ga melt, toward the substrate 100 or the like held on the susceptor 208. Further, a gas generator 233b is provided on a downstream of the gas supply pipe 232b, for containing solid aluminum (Al) as a raw material. A nozzle 249b is connected to the gas generator 233b, for supplying aluminum chloride ($AlCl_3$) gas as a film forming gas generated by a reaction of HCl gas and toward the substrate 100 or the like held on the susceptor 208. Nozzles 249c and 249d are connected to the downstream side of the gas supply pipes 232c and 232d, for supplying the film forming gas supplied from these gas supply pipes toward the substrate 100 or the like held on the susceptor 208. The nozzles 249a to 249d are arranged to flow the film forming gas in a direction crossing the main surface of the substrate 100 (oblique direction with respect to the main surface). Meanwhile, an exhaust pipe 230 is provided at the other end of the airtight container 203, for exhausting inside of the film formation chamber 201. A pump 231 for a blower) is provided in the exhaust, pipe 230. A zone heater 207 is provided on an outer peripheral edge of the airtight container 203, for heating the inside of the gas generators 233a and 23b and the substrate 100 and the like held on the susceptor 208, to a desired temperature, and a temperature sensor 209 is provided in the airtight container 203, for measuring a temperature in the film formation chamber 201, respectively. Note that the vicinity of the gas generator 233b of the zone heater 207 is maintained at a temperature of 400 to 600° C., thereby generating $AlCl_3$ gas by a reaction between the HCl gas and Al. Further, the vicinity of the gas generator 233a of the zone heater 207 is maintained at a temperature of 800 to 900° C., thereby generating GaCl gas by a reaction between the HCl gas and Ga melt. Further, the vicinity of the susceptor 208 of the zone heater 207 is maintained at a temperature suitable for growth described later. Each member of the HVPE apparatus 200 is connected to a controller 280 configured as a computer, so that a program executed on the controller 280 controls a processing procedure and a processing condition described later.

Step 2 can be performed by using the above-described HVPE apparatus 200, for example, by the following processing procedure.

In step 2, first, the substrate 100 is placed on the susceptor 208 in a state in which the front surface 102 side of the substrate 100 is protected.

Here, as in a comparative example shown in FIG. 3A, in the case that the substrate 100 is placed on the susceptor 208, so that, the front surface 102 side of the substrate 100 is in contact with a surface of the susceptor 208 (a bottom surface of the pocket 208p of the susceptor 208), there is a possibility that damage occurs on the front surface 102 of the substrate 100. When the damage occurs on the front surface 102 of the substrate 100, there is a possibility that defect occurs on the front side semiconductor layer 160, when the front side semiconductor layer 160 is grown on the front surface 102 side of the substrate 100 in step 3 described later.

Therefore, in this embodiment, as shown in FIG. 3B, for example, the substrate 100 is placed on the susceptor 208 so that the front surface 102 side of the substrate 100 faces the surface of the susceptor 208 (the bottom surface of the pocket 208p of the susceptor 208), while interposing a ring-like spacer 310 between the front surface 102 of the substrate 100 and the susceptor 208 so as to surround the peripheral edge of the front surface 102 of the substrate 100. Thereby, a gap 310a can be formed between the front surface 102 of the substrate 100 and the bottom surface of the pocket 208p of the susceptor 208. As a result, it is possible to prevent the front surface 102 of the substrate 100 from coming into contact with the susceptor 208, and the damage to the front surface 102 of the substrate 100 can be suppressed. Further, by providing the ring-like spacer 310 so as to surround the peripheral edge of the front surface 102 of the substrate 100, it is possible to prevent the film forming gas from being supplied to the front surface 102 of the substrate 100, and formation of the group III nitride semiconductor on the front surface 102 side of the substrate 100 in step 2 can be suppressed. In this way, the front surface 102 of the substrate 100 can be protected by the ring-like spacer 310. In this case, it is preferable that the ring-like spacer 310 has an outer diameter substantially equal to the outer diameter of the substrate 100, and an inner diameter smaller by 1 to 10 mm than the outer diameter of the substrate 100. Namely, a width of the ring-like spacer 310 in a radial direction of the substrate 100 is preferably about 0.5 to 5.0 mm. Further, a height (thickness) of the ring-like spacer 310 is preferably about 0.5 to 2 mm. A depth of the pocket 208p of the susceptor 208 is preferably such that the substrate 100 does not protrude from the upper surface of the susceptor 208, in a state that the ring-like spacer 310 is interposed between the front surface 102 of the substrate 100 and the susceptor 208. Namely, liar example, the depth of the pocket 208p is preferably equal to or more than the sum of the height of the ring-like spacer 310 and the thickness of the substrate 100.

Alternatively, in this embodiment, as shown in FIG. 3C, for example, a plate-like spacer 320 having a spacer bottom portion 320b and a spacer protruding portion 320p may be used. The spacer bottom portion 320b is formed in a plate shape. Further, the spacer protruding portion 320p protrudes from the spacer bottom 320b so as to surround the peripheral edge of the front surface 102 of the substrate 100. In this case, the spacer protruding portion 320p is brought into contact with the peripheral edge of the front surface 102 of the substrate 100 so that the front surface 102 side of the substrate 100 faces the spacer bottom portion 320b. Then, the substrate 100 is placed on the susceptor 208, while interposing the plate-like spacer 320 between the front surface 102 of the substrate 100 and the susceptor 208. Thereby a gap 320a can be formed between the front surface 102 of the substrate 100 and the spacer bottom portion 320b. As a result, the front surface 102 of the substrate 100 can be protected by the plate-like spacer 320 in the same way as the ring-like spacer 310. Further, dirt (particles or the like) is sometimes generated in the pocket 208p of the susceptor 208, and therefore in such a case, by using the plate-like spacer 320, the dirt in the pocket 208p can be blocked with the spacer bottom portion 320b. As a result, it is possible to suppress the dirt, from adhering to the front surface 102 of the substrate 100. In this case, as in the ring-like spacer 310, the plate-like spacer 320 has an outer diameter substantially equal to the outer diameter of the substrate 100, and the width of the plate-like spacer 320 in the radial direction of the substrate 100 is about 0.5 to 5.0 mm. The height (thickness) of the plate-like spacer 320 is preferably about 0.5 to 2 mm. Note that the depth of the pocket 208p of the susceptor 208 is preferably, for example, equal to or more than the sum of the height of the plate-like spacer 320 and the thickness of the substrate 100.

Further, the Ga melt is contained in the gas generator 233a as a raw material. Note that in step 2, the gas generator 233b is not used. Then, $H_2$ gas (or mixed gas of $H_2$ gas and $N_2$ gas) is supplied into the film formation chamber 201 from the gas supply pipe 232d, while rotating the susceptor and performing heating and exhausting in the film formation chamber 201. Then, gas supply is performed from the gas supply pipes 232a and 232c when the temperature inside of the film formation chamber 201 reaches a desired growth temperature, the pressure in the film formation chamber 201 reaches a growth pressure, and the atmosphere in the film formation chamber 201 reaches a desired atmosphere, and thereby GaCl gas and NH₃ gas are supplied as film forming gas in a direction crossing the back surface 101 of the substrate 100.

Thereby as shown in FIG. 4A, the back side semiconductor layer 120 comprises GaN is formed on the back surface 101 side of the substrate 100. At this time, the back side semiconductor layer 120 is formed on the roughened back surface 101 of the substrate 100 without interposing the buffer layer, and therefore the back side semiconductor layer 120 becomes polycrystalline. At this time, at the growth temperature of the back side semiconductor layer 120, the back side semiconductor layer 120 is formed in a state in which little stress is applied to the back surface 101 side of the substrate 100, and therefore the substrate 100 does not warp and is in a substantially flat state.

At this time, for example, the growth temperature of the back side semiconductor layer 120 in step 2 is previously made equal to the growth temperature of the front side semiconductor layer 160 in step 3 described later. Note that here, "to make the growth temperature of the back side semiconductor layer 120 equal to the growth temperature of the front, side semiconductor layer 160", includes not only a case that the respective growth temperatures are completely matched but also a case that slight error occurs in these growth temperatures. However, in this embodiment, even when the error occurs in each growth temperature, it is desirable to set the error within ±5%, preferably within ±1%, for example. Here, the growth temperature of the hack side semiconductor layer 120 in step 2 is, for example, 900° C. or more and 1200° C. or less, preferably 1000° C. or more and 1100° C. or less.

Further, at this time, the thickness of the hack side semiconductor layer 120 is previously set such that the internal stress of the back side semiconductor layer 120 and the internal stress of the front side semiconductor layer 160 are balanced, depending on the thickness of the front side semiconductor layer 160 to be formed in step 3 described later. Specifically, the thickness of the back side semiconductor layer 120 is set to be, for example, more than 20 μm, preferably equal to or more than 50 μm.

When the growth of the back side semiconductor layer 120 having a predetermined thickness is completed, supply of HCl gas and 112 gas into the film formation chamber 201, and heating by the heater 207 are stopped, with NH₃ gas and N₂ gas supplied into the film formation chamber 201 and the inside of the film formation chamber 201 exhausted. Then, when the temperature in the film formation chamber 201 reaches 500° C. or less, the supply of NH₃ gas is stopped, and thereafter the atmosphere in the film formation chamber 201 is replaced with N₂ gas to restore the atmospheric pressure, and the temperature of the film formation chamber 201 is lowered to a temperature at which the substrate 100 can be unloaded, and then the substrate 100 is unloaded from the film formation chamber 201.

At this time, as shown in FIG 4B, when the temperature of the substrate 100 is lowered from the growth temperature (for example, 1050° C.) of the back side semiconductor layer 120 to a room temperature (25° C.), the substrate 100 shrinks more than the back side semiconductor layer 120, due to the fact that the linear expansion coefficient of the sapphire substrate which is the substrate 100 is larger than the linear expansion coefficient of polycrystalline GaN. As a result,, the substrate 100 is warped so that the front surface 102 side is concave (so that the back side semiconductor layer 120 side is convex). However, even if the substrate 100 is warped, the internal stress generated in the back side semiconductor layer 120 can be isotropically dispersed, and generation of cracks in the back side semiconductor layer 120 and the substrate 100 can be suppressed, by making the back side semiconductor layer 120 polycrystalline.

(Step 3: Buffer Layer and Front Side Semiconductor Layer Forming Step)

Next, in step 3, a buffer layer 140, and a front side semiconductor layer 160 comprises a monocrystalline group III nitride semiconductor are formed, by supplying a predetermined film forming gas to the front surface 102 side of the substrate 100, using the same HVPE apparatus 200 as in step 2. Step 3 can be performed by the following processing procedure, for example.

In Step 3, first, as shown in FIG. 5A, the substrate 100 is directly placed on the susceptor 208, so that the back surface 101 side (the back side semiconductor layer 120 side) of the substrate 100 faces the surface of the susceptor 208 (the bottom surface of the pocket 208p of the susceptor 208), without using the ring-like spacer 310 or the like as described above. Further, the Ga melt is contained in the gas generator 233a as a raw material, and a solid Al is contained in the gas generator 233b as a raw material. Then, H₂ gas (or a mixed gas of H₂ gas and N₂ gas) is supplied from the gas supply pipe 232d into the film formation chamber 201, while rotating the susceptor 208 and performing heating and exhausting of the film formation chamber 201.

When the temperature inside of the film formation chamber 201 reaches a desired growth temperature (for example, 1000° C. or more and 1100° C. or less) and the pressure in the film formation chamber 201 reaches the growth pressure and the atmosphere in the film formation chamber 201 reaches a desired atmosphere, gas supply is performed from the gas supply pipes 232b and 232c, and AlCl₃ gas and NH₃ gas are supplied as film forming gases in a direction crossing the front surface 102 of the substrate 100. Thereby, the buffer layer 140 comprising AlN is formed on the front surface 102 side of the substrate 100. At this time, the thickness of the buffer layer 140 is, for example, 10 nm or more and 400 nm or less. When the growth of the buffer layer 140 having a predetermined thickness is completed, the supply of the HCl gas into the film formation chamber 201 is stopped. Meanwhile, the supply of the NH₃ gas is continued after completion of growth of a later-described front side semiconductor layer 160, until the temperature inside of the film formation chamber 201 becomes 500° C. or less. However, at this time, heating in the film formation chamber 201 by the heater 207, and exhausting of the film formation chamber 201 by the pump 231 are continued.

Next, the temperature in the film formation chamber 201 is changed to a desired growth temperature of the front side semiconductor layer 160. When the growth temperature of the buffer layer 140 is equal to the growth temperature of the front side semiconductor layer 160, the growth of the following front: side semiconductor layer 160 may be started without changing the temperature in the film formation chamber 201. Then, when the temperature inside of the film formation chamber 201 reaches a desired growth temperature (for example, 1000° C. or more and 1100° C. or less) and the pressure in the film formation chamber 201 reaches the growth pressure and the atmosphere in the film formation chamber 201 reaches a desired atmosphere, gas supply is performed from the gas supply pipes 232a and 232c, and GaCl gas is supplied as a film forming gas in a direction crossing the front surface 102 of the substrate 100.

Thereby, as shown in FIG. 5B, the front side semiconductor layer 160 comprising GaN is formed on the front surface 102 side of the substrate 100. At this time, the front side semiconductor layer 160 is formed on the front surface 102 of the substrate 100 interposing the buffer layer 140, and therefore the front side semiconductor layer 160 becomes monocrystalline by epitaxial growth on the buffer layer 140.

As described above, in step 2, the growth temperature of the back side semiconductor layer 120 is previously set equal to the growth temperature of the front side semiconductor layer 160 in step 3. Therefore, in step 3, when the temperature of the substrate 100 is raised to the growth temperature of the front side semiconductor layer 160, the state of the substrate 100 and the back side semiconductor layer 120 becomes equal to the state (FIG. 4A) in which the substrate 100 in step 2 is heated to the growth temperature of the back side semiconductor layer 120, and the substrate 100 does not warp and becomes substantially flat (FIG. 5A). Accordingly, in step 3, the front side semiconductor layer 160 is formed on the front surface 102 side of the substrate 100 in a state in which the substrate 100 is substantially flat (FIG. 5B).

At this time, for example, the thickness of the front side semiconductor layer 160 is a thickness exceeding the critical thickness at which cracks are generated in the front side semiconductor layer 160, in a case that only the front side semiconductor layer 160 is formed without forming the back side semiconductor layer 120 (in a case that step 2 is not performed).

As described above, the above-described critical thickness is classified into a first critical thickness, a second critical thickness, and a third critical thickness in order from the smaller, depending on the generation of cracks. The first critical thickness is for example a thickness at which cracks are generated in the front side semiconductor layer 160, when the nitride semiconductor template is heated to the growth temperature of the group III nitride semiconductor in a case of not performing the step 2. The second critical thickness is for example a thickness at which cracks are generated in the front side semiconductor layer 160 after elapse of a predetermined time from formation of the front side semiconductor layer 160 in a case of not performing the step 2. Further, the third critical thickness is for example a thickness at which cracks are generated in the front side semiconductor layer, immediately after formation of the front side semiconductor layer 160 in a case of not performing the step 2.

Here, the thickness of the front side semiconductor layer 160 is, for example, a thickness exceeding the above-described third critical thickness, that is, it is more than 20 μm, preferably 50 μm or more.

When the growth of the front side semiconductor layer 160 having a predetermined thickness is completed, supply of HCl gas and $H_2$ gas into the film formation chamber 201, and heating by the heater 207 are stopped, while supplying the $NH_3$ gas and the $N_2$ gas into the film formation chamber 201, and exhausting the inside of the film formation chamber 201. Then, when the temperature in the film formation chamber 201 reaches 500° C. or less, supply of $NH_3$ gas is stopped, and thereafter, the atmosphere in the film formation chamber 201 is replaced with $N_2$ gas to return to the atmospheric pressure, and the temperature of the film formation chamber 201 is lowered to a temperature at which the substrate 100 can be unloaded, and then is unloaded from the film formation chamber 201.

As described above, in step 2, the thickness of the back side semiconductor layer 120 is previously set such that the internal stress of the back side semiconductor layer 120 and the internal stress of the front side semiconductor layer 160 are balanced, in consideration of the thickness of the front side semiconductor layer 160. Therefore, in step 3, even if the temperature of the substrate 100 is lowered from the growth temperature of the back side semiconductor layer 120 to a room temperature after forming the front side semiconductor layer 160 on the front surface 102 side of the substrate 100, the internal stress generated in the back side semiconductor layer 120 and the internal stress generated in the front side semiconductor layer 160 are canceled, and the warping of the substrate 100 (the nitride semiconductor template 10) is reduced.

As described above, the nitride semiconductor template 10 of this embodiment shown in FIG. 1 is manufactured. The nitride semiconductor template 10 manufactured in this way, is for example used for manufacturing a semiconductor device such as a light-emitting device.

When manufacturing a semiconductor device such as a light-emitting device using the nitride semiconductor template 10 of this embodiment, there are cases that the thickness of the semiconductor device is decreased, by removing the back side semiconductor layer 120 and a part of the substrate 100 by polishing or the like. In this case, by removing the back side semiconductor layer 120, the internal stress of the back side semiconductor layer 120 and the internal stress of the front side semiconductor layer 160 cannot be balanced, and there is a possibility that the semiconductor device is warped. Therefore, when the back side semiconductor layer 120 and a part of the substrate 100 are scraped off by polishing or the like, it is preferable to decrease the thickness of the semiconductor device in a state in which the front surface 102 side (the front side semiconductor layer 160 side) of the substrate 100 is attached to a predetermined supporting substrate. Thereby, even if the back side semiconductor layer 120 is removed, occurrence of warping of the semiconductor device can be suppressed.

(3) Effects Obtained by this Embodiment

According to this embodiment, one or more of the following effects can be obtained.

(a) In the nitride semiconductor template 10 of this embodiment, the front side semiconductor layer 160 comprises a monocrystalline group III nitride semiconductor is provided on the front surface 102 side of the substrate 100, and meanwhile the back side semiconductor layer 120 comprising a polycrystalline group III nitride semiconductor is provided on the back surface 101 side of the substrate 100. Thereby, when the temperature of the nitride semiconductor template 10 is changed from the growth temperature of the front side semiconductor layer 160, the internal stress generated in the front side semiconductor layer 160 can be canceled by the internal stress generated in the back side semiconductor layer 120. As a result, it is possible to reduce the warp of the nitride semiconductor template 10 and suppress the generation of cracks in the nitride semiconductor template 10. Accordingly, it is possible to improve the yield in manufacturing the nitride semiconductor template 10.

(b) Since the back side semiconductor layer 120 comprises a polycrystalline group III nitride semiconductor, a crystal orientation in the back side semiconductor layer 120 is random, that is, a cleavage direction is random. Thereby; generation of cracks in a specific cleavage direction in the back side semiconductor layer 120 can be suppressed. Further, even if the internal stress occurs in the back side semiconductor layer 120, the internal stress can be isotropically dispersed. As a result, even if the back side semiconductor layer 120 is formed thicker than the front side semiconductor layer 160, the back side semiconductor layer 120 can be hardly broken.

(c) Since the back side semiconductor layer 120 can be formed thick, it is possible to increase the thickness of the front side semiconductor layer 160 while suppressing warping and cracking of the nitride semiconductor template 10.

For example, the thickness of the front side semiconductor layer 160 can be the thickness exceeding the first critical thickness at which cracks are generated in the front side semiconductor layer 160, when the nitride semiconductor template in a case of forming only the front side semiconductor layer 160 without forming the back side semiconductor layer 120, is heated to the growth temperature of the group III nitride semiconductor. Even if the thickness of the front side semiconductor layer 160 is more than the first critical thickness, due to formation of the back side semiconductor layer 120 as described above, it is possible to suppress the generation of cracks in the front side semiconductor layer 160 when the nitride semiconductor template 10 is heated to the growth temperature of the group III nitride semiconductor. As a result, for example, it is possible to stably grow a laminate such as a light emitting layer on the nitride semiconductor template 10 by heating the nitride semiconductor template 10 to a desired growth temperature of the group III nitride semiconductor.

Alternatively, for example, the thickness of the front side semiconductor layer 160 can be the thickness exceeding the second critical thickness at which cracks are generated in the front side semiconductor layer 160 after elapse of a predetermined time from the formation of the front side semiconductor layer 160, in a case that only the front side semiconductor layer 160 is formed without forming the back side semiconductor layer 120. Even if the thickness of the front side semiconductor layer 160 is more than the second critical thickness, due to formation of the back side semiconductor layer 120 as described above, it is possible to suppress the generation of cracks in the front side semiconductor layer 160 after elapse of a predetermined time from formation of the front side semiconductor layer 160. As a result, the nitride semiconductor template 10 can be stored over a long period of time without generating cracks or can be distributed stably to the market.

Alternatively, the thickness of the front side semiconductor layer 160 can be, for example, the thickness exceeding the third critical thickness at which cracks are generated in the front side semiconductor layer 160 immediately after formation of the front side semiconductor layer 160, in a case that only the front side semiconductor layer 160 is formed without forming the back side semiconductor layer 120. Even if the thickness of the front side semiconductor layer 160 is more than the third critical thickness, due to formation of the back side semiconductor layer 120 as described above, it is possible to suppress the generation of cracks in the front side semiconductor layer 160 immediately after formation of the front side semiconductor layer 160.

Thus, it is possible to obtain the front side semiconductor layer 160 with high yield, the front side semiconductor layer 160 having such a thickness as to be impossible with the conventional nitride semiconductor template in which only the front side semiconductor layer 160 is formed without forming the back side semiconductor layer 120. As a result the dislocation density of the front side semiconductor layer 160 can be lowered.

(d) Since the back side semiconductor layer 120 comprises the polycrystalline group III nitride semiconductor, light absorption due to crystal defects can be high and transmittance of light from the visible region to the infrared region can be low, in the back side semiconductor layer 120. Thereby, the visibility of the nitride semiconductor template 10 can be improved. As a result, in the manufacturing step of the nitride semiconductor template 10 and the manufacturing step of the semiconductor device using the nitride semiconductor template 10, generation of handling error of the nitride semiconductor template 10 can be suppressed, and further it is easy to recognize an image of the nitride semiconductor template 10 when the manufacturing step is automated. Further, since the transmittance of the back side semiconductor layer 120 can be low, the heat absorption rate of the nitride semiconductor template 10 can be improved. As a result, the rate of temperature rise of the nitride semiconductor template 10 (substrate 100) can be improved, and the growth time of the front side semiconductor layer 160 and the growth time of the semiconductor layer grown on the nitride semiconductor template 10 can be shortened.

(e) Since the thickness of the back side semiconductor layer 120 is 50 μm or more, the visibility and heat absorption rate of the nitride semiconductor template 10 can be more reliably improved. As a result, it is possible to more reliably improve the yield and productivity in the manufacturing step of the nitride semiconductor template and the manufacturing step of the semiconductor device using the nitride semiconductor template 10.

(f) Since the thickness of the front side semiconductor layer 160 is increased, the dislocation density on the front surface side of the front side semiconductor layer 160 can be $5 \times 10^7$ $cm^{-2}$ or less, preferably to $1 \times 10^7$ $cm^{-2}$ or less. Thus, in the nitride semiconductor template, 10 using the substrate, 100 such as a sapphire substrate, it is possible to realize a low dislocation density ($10^6$ $cm^{-2}$) equivalent to that of a free-standing substrate composed only of the group III nitride semiconductor. Further, since the front side semiconductor layer 160 having such a low dislocation density is used as the growth underlayer, the semiconductor layer with good crystallinity can be grown on the front side semiconductor layer 160. As a result, since a low-cost substrate 100 such as a sapphire substrate is used, it is possible to manufacture a high-quality semiconductor device while reducing the manufacturing cost as compared with the free-standing substrate. For example, by using the nitride semiconductor template 10 of this embodiment, a highly efficient light-emitting device or the like can be manufactured at low cost.

(g) In this embodiment, after forming the back side semiconductor layer 120 on the back surface 101 side of the substrate 100 in step 2, the front side semiconductor layer 160 is formed on the front surface 102 side of the substrate 100 in step 3. At this time, since the back side semiconductor layer 120 is polycrystalline, even if the back side semiconductor layer 120 is formed thicker before forming the front side semiconductor layer 160, it is possible to make the back side semiconductor layer 120 hard to break. Further, since the front side semiconductor layer 160 is formed after forming the back side semiconductor layer 120, it is possible to prevent the front side semiconductor layer 160 from being damaged by thermal etching or the like. Thereby, a high-quality nitride semiconductor template 10 can be obtained with high yield.

(h) Since the damage of the front side semiconductor layer 160 such as thermal etching is suppressed, the surface roughness on the front surface of the front side semiconductor layer 160 can be kept small. Specifically, for example, RMS on the surface of the front side semiconductor layer 160 can be 2 nm or less in as-grown state of the front side semiconductor layer 160. Thereby, the step of polishing the front side semiconductor layer 160 after forming the front side semiconductor layer 160 can be omitted.

As a result, it is possible to reduce the manufacturing cost of the nitride semiconductor template 10. Further, since the front side semiconductor layer 160 having a small surface roughness is used as the growth underlayer, the semiconductor layer with good crystallinity can be grown on the front side semiconductor layer 160. As a result, by using the nitride semiconductor template 10, a high-quality semiconductor device can be manufactured.

(i) Since the internal stress of the front side semiconductor layer 160 is canceled by the internal stress of the hack side semiconductor layer 120 as described above, the warping amount of the nitride semiconductor template 10 can be within ±200 μm at room temperature (25° C.). Thereby, it is possible to suppress the occurrence of the focal deviation in photolithography in the manufacturing step of the semiconductor device such as the light emitting device using the nitride semiconductor template 10. As a result, it is possible to suppress pattern defects in the semiconductor device and to improve the yield in the manufacturing step of the semiconductor device.

(4) Modified Example of this Embodiment

The configuration of the nitride semiconductor template 10 of this embodiment is not limited to the configuration of the above-described embodiment, and can be changed as in the following modified example. Hereinafter, only the elements different from those in the above-described embodiment will be described, and elements that are substantially the same as the elements described in the above embodiment will be denoted by the same reference numerals and description thereof will be omitted.

Modified Example 1

Figure 6:
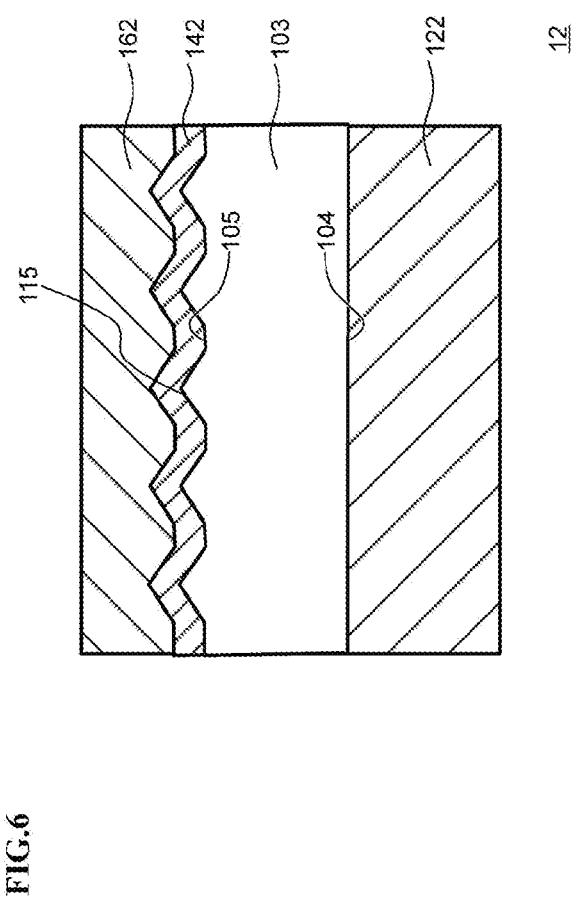
FIG. 6 is a cross-sectional view showing a nitride semiconductor template according to a modified example 1 of an embodiment of the present invention.

FIG. 6 is a cross-sectional view showing a nitride semiconductor template according to a modified example 1 of an embodiment of the present invention. The substrate 103 may be configured as a so-called PSS (Patterned Sapphire Substrate) substrate like the nitride semiconductor template 12 of the modified example 1 shown in FIG. 6 (namely, instead of the substrate 100 of the above-described embodiment, the substrate 103 which is a PSS substrate may be used). Specifically, the front surface 105 of the substrate 103 has a plurality of protrusions 115 provided periodically two dimensionally (in plan view). The plurality of protrusions 115 are arranged, for example, at equal intervals, each being arranged in a lattice pattern such as a triangular lattice shape, a square lattice shape or the like when a surface 105 is viewed in a plan view. Each protrusion 115 is, for example, conical, polyangular pyramidal, hemispherical, or the like. For example, a height of each protrusion 115 (the height from a flat portion of the surface 105 to a top portion of the protrusion 115) is 0.3 μm or more and 3 μm or less, and a width of a bottom portion of the protrusion 115 is 0.2 μm or more and 4 μm or less, and a pitch between adjacent protrusions 115 is 0.4 μm or more and 6 μm or less.

Note that the back surface 104 of the substrate 103 is, for example, a rough surface having random irregularities. RMS on the back surface 104 of the substrate 103 is, for example, 0.5 μm or more and 5 μm or less.

A back side semiconductor layer 122 is provided on the back surface 104 side of the substrate 103. The back side semiconductor layer 122 comprises a polycrystalline group III nitride semiconductor as in the above embodiment. The thickness of the back side semiconductor layer 120 is, and is set such that the internal stress of the back side semiconductor layer 120 and the internal stress of the front side semiconductor layer 160 are balanced, and thereby the thickness is for example, more than 20 μm, preferably equal to or more than 50 μm.

Meanwhile, a buffer layer 142 is provided on the front surface 105 side of the substrate 103. The buffer layer 142 is provided so as to follow a plurality of protrusions 115 provided on the front surface 105 of the substrate 103. Protrusions corresponding to the protrusions 115 on the front surface 105 of the substrate 103 are formed on the front surface (upper surface) of the buffer layer 142. The buffer layer 142 comprises the group III nitride semiconductor as in the above embodiment. The thickness of the buffer layer 142 is, for example, 10 nm or more and 400 nm or less.

A front side semiconductor layer 162 is provided on the buffer layer 142. As in the above-described embodiment the front side semiconductor layer 162 comprises a monocrystalline group III nitride semiconductor. The front side semiconductor layer 162 is grown until its surface becomes flat. Namely, the thickness of the front side semiconductor layer 162 is the thickness such that the front surface of the front side semiconductor layer 162 is flat, and is the thickness exceeding the critical thickness at which cracks are generated in the front side semiconductor layer 162, in a case that only the front side semiconductor layer 162 is formed without forming the back side semiconductor layer 122. Specifically, the thickness of the front side semiconductor layer 162 is, for example, the thickness exceeding the above-described third critical thickness, namely, the thickness more than 20 μm, preferably equal to or more than 50 μm. Further, the surface roughness films on the front surface of the front side semiconductor layer 160 is for example 2 nm or less in as-grown state (a state in which no polishing or the like is performed) of the front side semiconductor layer 160.

The method for manufacturing the nitride semiconductor template 12 of the modified example 1 is the same as the above embodiment, except that a PSS substrate is used as the substrate 103 (instead of the substrate 100).

According to the modified example 1, since the light emitting device is manufactured using the nitride semiconductor template 12, the light generated from the light emitting layer of the light emitting device can be scattered at the protrusions 115 of the front surface 105 of the substrate 103. Thereby, it is possible to suppress the light generated from the light emitting layer from being totally reflected and confined within the light emitting device and to improve the light extraction efficiency of the light emitting device.

Further, according to the modified example 1, even when the PSS substrate is used as the substrate 103, the generation of cracks in the nitride semiconductor template 12 can be suppressed. This is because in a case that the PSS substrate is used as the substrate 103, when the thickness of the front side semiconductor layer 162 is increased, the internal stress generated in the front side semiconductor layer 162 is concentrated on (the portion corresponding to) the protrusions 115 provided on the front surface 105 of the substrate 103, and cracks are likely to he generated in the front side semiconductor layer 162 with the protrusions 115 as starting points. Therefore, in the modified example 1, the internal stress that occurs in the front side semiconductor layer 162 is canceled by the internal stress that occurs in the back side semiconductor layer 122, to thereby suppress the concentration of the internal stress of the front side semiconductor layer 162 on the protrusions 115. Thereby, the generation of cracks in the front side semiconductor layer 162 starting from the protrusions 115 can be suppressed.

In the first modified example described above, explanation is given for a case that, the front surface 105 of the substrate 103 has a plurality of protrusions 115 periodically provided two-dimensionally. However, the front surface 105 of the substrate 103 may have a plurality of protrusions periodically provided one-dimensionally. Namely, each of the plurality of protrusions extends in a predetermined direction along the front surface 105 of the substrate 103, and the plurality of protrusions may be periodically provided at equal intervals in a direction intersecting the extending direction.

Further, in the above-described modified example 1, explanation is given for a case that the front surface 105 of the substrate 103 has a plurality of protrusions 115. However, the front surface 105 of the substrate 103 may have a plurality of recesses periodically provided one-dimensionally or two-dimensionally.

Modified Example 2

Figure 7A:
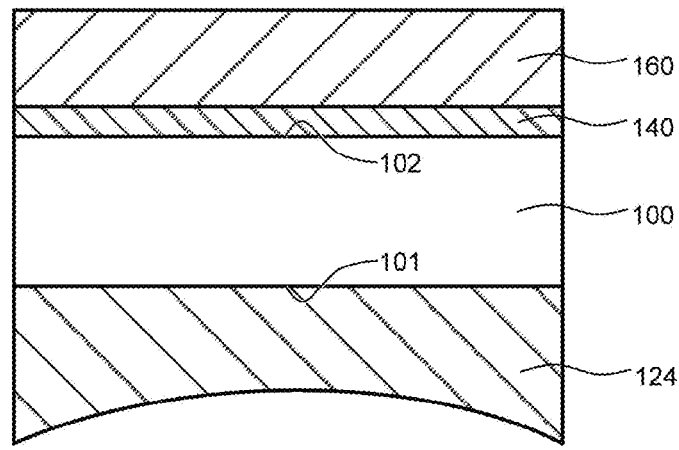
FIG. 7A is a cross-sectional view showing a nitride semiconductor template according to a modified example 2 of an embodiment of the present invention.

FIG. 7A is a cross-sectional view showing a nitride semiconductor template according to a modified example 2 of an embodiment of the present invention. As in the nitride semiconductor template 14 of the second modified example 2 shown in FIG. 7A, the thickness of the back side semiconductor layer 124 may be uneven within the back surface 101 of the substrate 100. Specifically, for example, the outer peripheral side thickness of the back side semiconductor layer 124 may be larger than the center side thickness of the back side semiconductor layer 124. "The outer peripheral side thickness of the back side semiconductor layer 124" means, for example, an average thickness in a region within ⅓ of the radius of the substrate 100 from the outer peripheral edge portion of the back side semiconductor layer 126 toward the center side. Alternatively, "the outer peripheral side thickness of the back side semiconductor layer 124" may be regarded as, for example, the thickness of the peripheral edge portion of the back side semiconductor layer 124.

In step 2 of the manufacturing step of the modified example 3, for example, it is possible to obtain a predetermined thickness distribution of a back side semiconductor layer 124, by setting the outer peripheral side temperature of the substrate 100 to be higher than the center side temperature of the substrate 100, or by increasing the flow rate (supply amount) of the film forming gas to the outer peripheral side of the substrate 100 to be greater than the flow rate of the film forming gas to the center side of the substrate 100.

According to the modified example 2, when the internal stress of the front side semiconductor layer 160 becomes uneven in the plane, the internal stress of the front side semiconductor layer 160 can be canceled by the internal stress of the back side semiconductor layer 124 in accordance with the distribution by thickening the back side semiconductor layer 124 corresponding to a portion where the internal stress of the front side semiconductor layer 160 becomes strong. Thereby, even in the case that the internal stress of the front side semiconductor layer 160 becomes uneven in the plane, occurrence of warping of the nitride semiconductor template 14 can be suppressed.

Modified Example 3

Figure 7B:
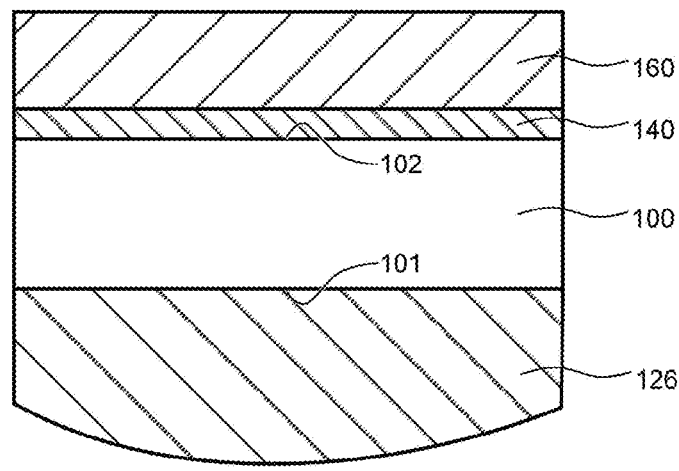
FIG. 7B is a cross-sectional view showing a nitride semiconductor template according to a modified example 3 of an embodiment of the present invention.

FIG. 7B is a cross-sectional view showing a nitride semiconductor template according to the modified example 3 of an embodiment of the present invention.

As in the nitride semiconductor template 16 of the modified example 3 shown in FIG. 7B, the thickness of the back side semiconductor layer 126 may have a distribution opposite to the distribution of the thickness of the back side semiconductor layer 124 of the modified example 2. Namely, for example, the outer peripheral side thickness of the back side semiconductor layer 126 may be smaller (thinner) than the center side thickness of the back side semiconductor layer 126.

In step 2 of the manufacturing step of the modified example 3, it is possible to obtain the predetermined thickness distribution of the back side semiconductor layer 126, for example, by setting the outer peripheral side temperature of the substrate 100 to be lower than the center side temperature of the substrate 100, or by setting the flow rate (supply amount) of the film forming gas to the outer peripheral side of the substrate 100 to be lower than the flow rate of the film forming gas to the center side of the substrate 100.

According to the modified example 3, even in a case that the internal stress of the front side semiconductor layer 160 is distributed opposite to that of the second modified example, occurrence of warping of the nitride semiconductor template 16 can be suppressed.

Modified Example 4

Figure 8:
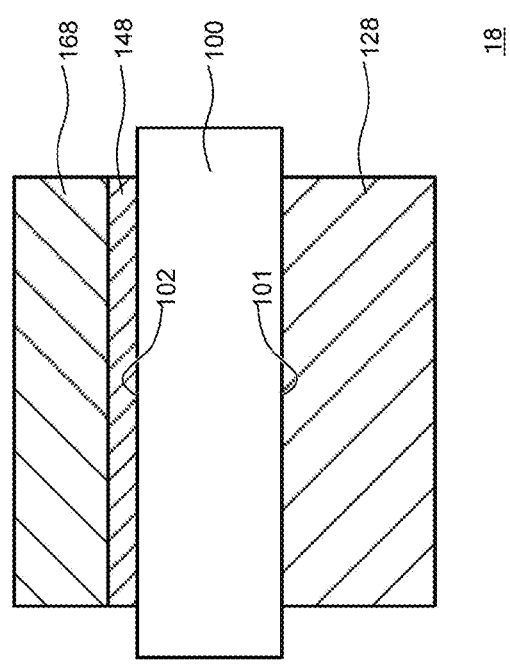
FIG. 8 is a cross-sectional view showing a nitride semiconductor template according to a modified example 4 of an embodiment of the present invention.

FIG. 8 is a cross-sectional view showing a nitride semiconductor template according to a modified example 4 of an embodiment of the present invention.

At least one of the back side semiconductor layer 128 and the front side semiconductor layer 168, may have a non-growth region in the vicinity of the peripheral edge portion of the substrate 100, as in the nitride semiconductor template 18 of the modified example 4 shown in FIG. 8.

The thickness of the back side semiconductor layer 128 in the modified example 4 is, for example, more than 60 μm. If the thickness of the back side semiconductor layer 128 is more than 60 μm, (even if the back side semiconductor layer 128 is polycrystalline) cracks are likely to occur in at least one of the back side semiconductor layer 128 and the substrate 100, in a case of providing the back side semiconductor layer 128 up to the peripheral edge portion of the back surface 101 of the substrate 100. This is mainly caused by uneven stress distribution at the peripheral edge of the substrate 100, chipping of the peripheral edge portion of the substrate 100, and the like.

Therefore, in the modified example 4, the back side semiconductor layer 128 is provided, with a space from the peripheral edge portion of the back surface 101 of the substrate 100. Thereby, even in a case that the thickness of the back side semiconductor layer 128 is large, the generation of cracks in the back side semiconductor layer 128 and the substrate 100 can be suppressed.

Specifically, the back side semiconductor layer 128 is provided in a region excluding the region of 0.5 mm or more and 5 mm or less from the peripheral edge portion of the back surface 101 toward the center side, on the back surface 101 side of the substrate 100. Hereinafter, a region where the back side semiconductor layer 128 is not provided is referred to as a "non-growth region" of the back side semiconductor layer 128. The non-growth region of the back side semiconductor layer 128 is formed so as to surround the peripheral edge of the back surface 101 of the substrate 100. If the width of the non-growth region of the back side semiconductor layer 128 is less than 0.5 mm, there is a possibility that a crack suppressing effect by the non-growing region cannot be sufficiently obtained. In contrast, by setting the width of the non-growth region of the back side semiconductor layer 128 to 0.5 mm or more, it is possible to sufficiently obtain the crack suppressing effect by the non-growth region. Meanwhile, if the width of the non-growth region of the back side semiconductor layer 128 is more than 5 mm, the area for obtaining a warp reducing effect (stress canceling effect) by the back side semiconductor layer 128 is narrowed, although it is possible to obtain the crack suppressing effect by the non-growth region. In contrast, by setting the width of the non-growth region of the back side semiconductor layer 128 to 5 mm or less, it is possible to secure the warp reducing effect by the back side semiconductor layer 128 while maintaining the crack suppressing effect by the non-growth region.

Further, the thickness of the front side semiconductor layer 168 in the modified example 4 is, for example, more than 50 µm. If the thickness of the front side semiconductor layer 168 is more than 50 µm, cracks are likely to generate in the front side semiconductor layer 168 and the substrate 100 in the case that the front side semiconductor layer 168 is provided up to the peripheral edge portion of the front surface 102 of the substrate 100. This is mainly due to uneven stress distribution at the peripheral edge of the substrate 100, chipping of the peripheral edge portion of the substrate 100, and the like, as in the back side semiconductor layer 128.

Therefore, in the modified example 4, the front side semiconductor layer 168 is provided, with a space from the peripheral edge portion of the front surface 102 of the substrate 100. Thereby, even in a case that the thickness of the front side semiconductor layer 168 is large, the generation of cracks in at least one of the front side semiconductor layer 168 and the substrate 100 can be suppressed. In this case, the buffer layer 148 is also provided, with a space from the peripheral edge portion of the front surface 102 of the substrate 100, as in the front, side semiconductor layer 168.

Specifically, the front side semiconductor layer 168 is provided in a region excluding a region of 0.5 mm or more and 5 mm or less from the peripheral edge portion of the front surface 102 toward the center side, on the front surface 102 side of the substrate 100. Hereinafter, similarly to the back side semiconductor layer 128, a region where the front side semiconductor layer 168 is not provided is referred to as a "non-growth region" of the front side semiconductor layer 168. The non-growth region of the front side semiconductor layer 168 is formed to surround the peripheral edge of the front surface 102 of the substrate 100. If the width of the non-growth region of the front side semiconductor layer 168 is less than 0.5 mm, there is a possibility that the crack suppressing effect by the non-growing region cannot be sufficiently obtained. In contrast, by setting the width of the non-growth region of the front side semiconductor layer 168 to 0.5 mm or more, it is possible to sufficiently obtain the crack suppressing effect by the non-growth region. Meanwhile, if the width of the non-growth region of the front side semiconductor layer 168 is more than 5 mm, an effective area, of the growth underlayer for growing the laminate such as the light emitting layer becomes narrow, although the crack suppression effect by the non-growth region can be obtained. As a result, productivity of the semiconductor device 20 is lowered. In contrast, by setting the width of the non-growth region of the back side semiconductor layer 128 to 5 mm or less, it is possible to secure the effective area as the growth underlayer to a predetermined value or more, while maintaining the effect of suppressing cracks by the non-growth region. As a result, it is possible to suppress lowering of productivity of the semiconductor device 20.

Next, the manufacturing step of the modified example 4 will be described with reference to FIG. 9. FIG. 9A is a cross-sectional view showing a placement state of the substrate in step 2 of the modified example 4, and FIG. 9B is a cross-sectional view showing a placement state of the substrate in step 3 of the modified example 4.

In step 2 of the modified example 4, as shown in FIG. 9A, when placing the substrate 100 on the susceptor 208, the peripheral edge of the back surface 101 of the substrate 100 is covered so as to suppress the formation of the back side semiconductor layer 128 on the peripheral edge of the back surface 101 of the substrate 100. Specifically, for example, a ring-like peripheral cover 340 covers the back surface 101 side of the substrate 100, with the substrate 100 placed on the susceptor 208 interposing the plate-like spacer 320. The peripheral cover 340 has, for example, a disc portion (signs and numerals are not shown) having an opening at the center and covering the peripheral edge of the back surface 101 of the substrate 100, and a peripheral side portion (signs and numerals are not shown) connected to the outer peripheral edge of the disc portion and surrounding the side face of the substrate 100. Since the peripheral edge of the back surface 101 of the substrate 100 is covered with the disc portion of the peripheral cover 340, formation of the back side semiconductor layer 128 on the peripheral edge of the back surface 101 of the substrate 100 can be suppressed, and the back side semiconductor layer 128 can be formed, with a space from the peripheral edge portion of the back surface 101 of the substrate 100. Further, since the peripheral side portion of the peripheral cover 340 surrounds the side face of the substrate 100, the peripheral cover 340 can be accurately positioned with respect to the substrate 100. Further, flirt-nation of the back side semiconductor layer 128 on the side face of the substrate 100 can be suppressed. Note that the inner diameter of the disc portion of the peripheral cover 340 is preferably smaller by 1 to 10 min than the diameter of the substrate 100 (namely, the width of the disc portion at one side is about 0.5 to 5 mm).

Then, in step 3 of the modified example 4, as shown in FIG. 9B, when the substrate 100 is placed on the susceptor 208, the peripheral edge of the front surface 102 of the substrate 100 is covered so as to suppress the formation of the front side semiconductor layer 168 on the peripheral edge of the front surface 102 of the substrate 100. Specifically, for example, similarly to step 2, the peripheral cover 360 covers the front surface 102 side of the substrate 100, with the substrate 100 placed on the susceptor 208. The peripheral cover 360 is configured, for example, similarly to the peripheral cover 340 described above, and has a disc portion (signs and numerals are not shown) and a peripheral side portion (signs and numerals are not shown). Since the peripheral edge of the front surface 102 of the substrate 100 is covered with the disc portion of the peripheral cover 360, formation of the front side semiconductor layer 168 on the peripheral edge of the front surface 102 of the substrate 100 can be suppressed, and the front side semiconductor layer 168 can be formed, with a space from the peripheral edge portion of the front surface 102 of the substrate 100. Further, since the peripheral side portion of the peripheral cover 360 surrounds the side face of the substrate 100, the peripheral cover 360 can be accurately positioned with respect to the substrate 100. Further, formation of the front side semiconductor layer 168 on the side face of the substrate 100 can be suppressed. Note that the inner diameter of the disc portion of the peripheral cover 360 is preferably smaller by about 1 to 10 mm than the diameter of the substrate 100 (namely, the width of the disc portion at one side is about 0.5 to 5 min).

According to the modified example 4, since the back side semiconductor layer 128 is provided, with a space from the peripheral edge portion of the back surface 101 of the substrate 100, the generation of cracks in at least one of the back side semiconductor layer 128 and the substrate 100 due to uneven stress distribution at the peripheral edge of the substrate 100, chipping of the peripheral edge portion of the substrate 100 or the like, can be suppressed even when the thickness of the back side semiconductor layer 128 is increased. Specifically, for example, it is possible to reliably suppress the generation of cracks in the back side semiconductor layer 128 and the substrate 100, for example, if the thickness of the hack side semiconductor layer 128 is within a range of 200 µm or less.

Further, according to the modified example 4, since the front side semiconductor layer 168 is provided, with a space from the peripheral edge of the front surface 102 of the substrate 100, the generation of cracks in the front side semiconductor layer 168 and the substrate 100 due to uneven stress distribution at the peripheral edge of the substrate 100, chipping of the peripheral edge portion of the substrate 100 or the like, can be suppressed even when the thickness of the front side semiconductor layer 168 is increased. Specifically; for example, it is possible to reliably suppress the generation of cracks in at least one of the front side semiconductor layer 168 and the substrate 100, for example, if the thickness of the front side semiconductor layer 168 is within a range of 180 µm or less.

Further, according to the modified example 4, since the thickness of the front side semiconductor layer 168 is increased, the dislocation density of the front side semiconductor layer 168 can be further lowered, compared with a case that the non-growth region of the front side semiconductor layer 168 is not provided, in a nitride semiconductor template 18 using a substrate 100 such as a sapphire substrate, it is possible to reliably realize, a low dislocation density (106 cm$^{-2}$ range) equivalent to that of a free-standing substrate composed only of the group III nitride semiconductor.

In step 2 of the modified example 4 described above, explanation is given for a case in which the peripheral cover 340 is used to cover the peripheral edge of the back surface 101 of the substrate 100. However, a cover layer for suppressing the formation of the back side semiconductor layer 128 may be formed on the peripheral edge of the back surface 101 of the substrate 100. In this case, for example, a silicon oxide (SiO$_2$) layer may be formed as the cover layer.

Further, in step 3 of the modified example 4, explanation is given for a case in which the peripheral cover 360 is used to cover the peripheral edge of the front surface 102 of the substrate 100. However, the cover layer for suppressing the formation of the front side semiconductor layer 168 may be formed on the peripheral edge of the front surface 102 of the substrate 100. In this case, for example, SiO$_2$ layer may be formed as the cover layer.

Modified Example 5

The nitride semiconductor free-standing substrate 30 may be manufactured as in the following modified example 5 by using the nitride semiconductor template 18 of the above-described modified example 4.

Figure 10A:
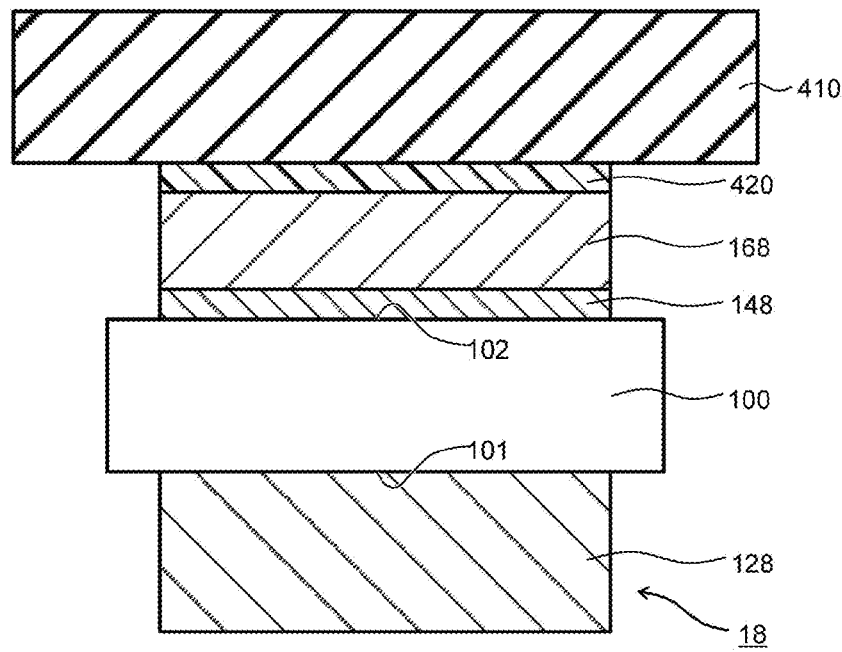
FIG. 10A is a cross-sectional view showing a state in which a front side supporting substrate is attached to a front surface side of the front side semiconductor layer in step 4 of the modified example 5.
Figure 10B:
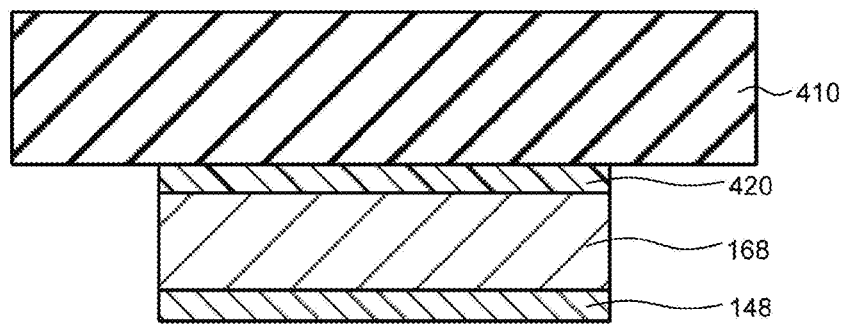
FIG. 10B is a cross-sectional view showing a state in which a back side semiconductor layer and the substrate are removed from a front surface side of the front side semiconductor layer in step 4 of the modified example 5.
Figure 11A:
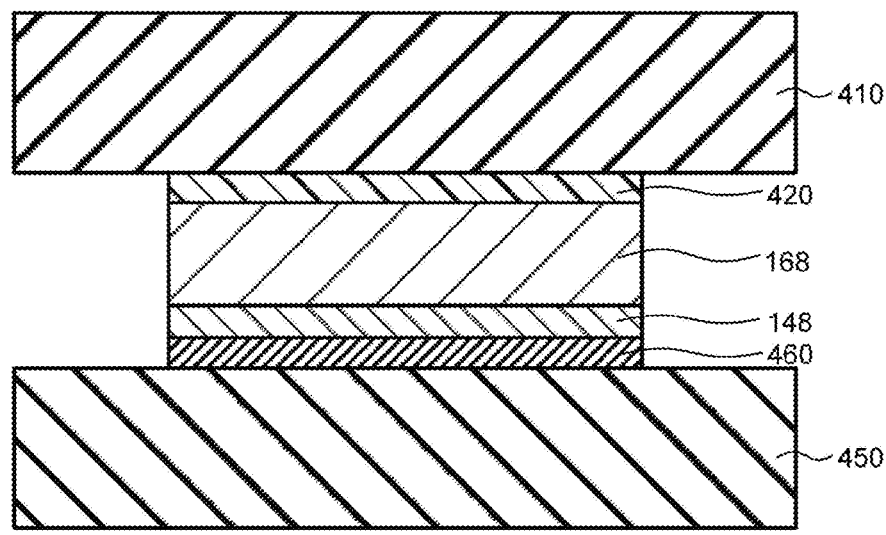
FIG. 11A is a cross-sectional view showing a state in which the back side supporting substrate is attached to a back surface side of the front side semiconductor layer in step 4 of the modified example 5.
Figure 11B:
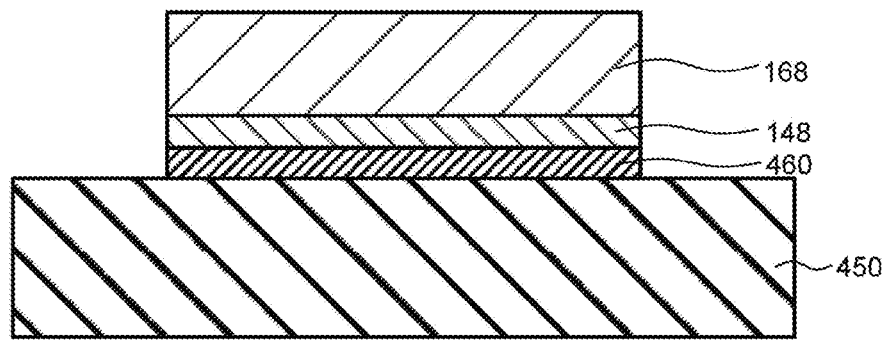
FIG. 11B is a cross-sectional view showing a state in which the front side supporting substrate is removed from the front surface side of the front side semiconductor layer in step 4 of the modified example 5.
Figure 12A:
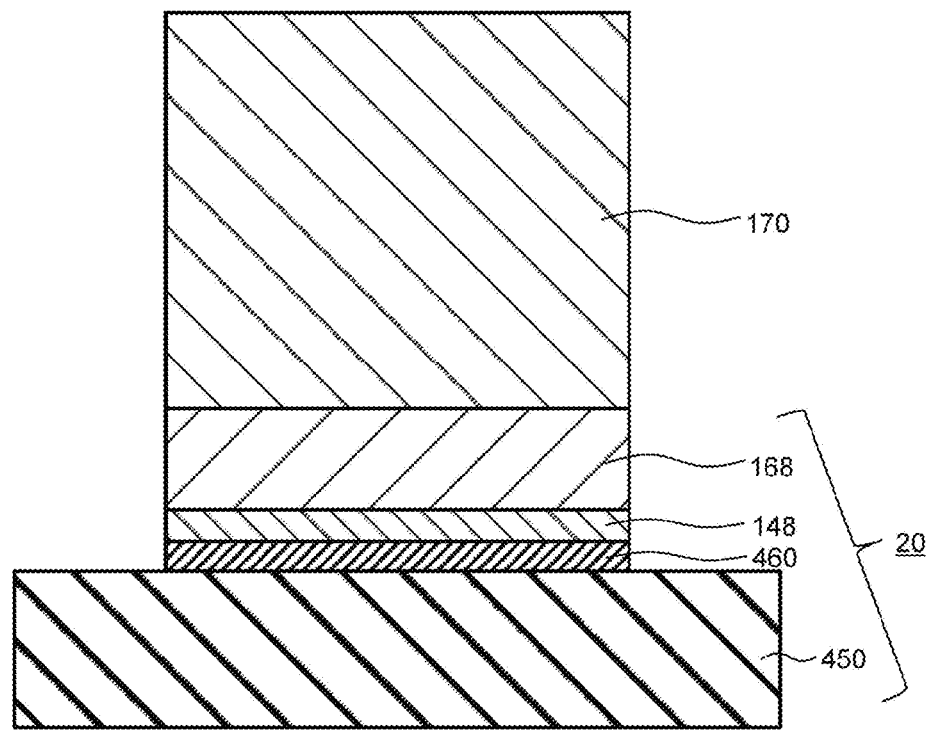
FIG. 12A is a cross-sectional view showing a state in which a full-scale growth layer is farmed on the front side semiconductor layer in step 5 of the modified example 5.
Figure 12B:
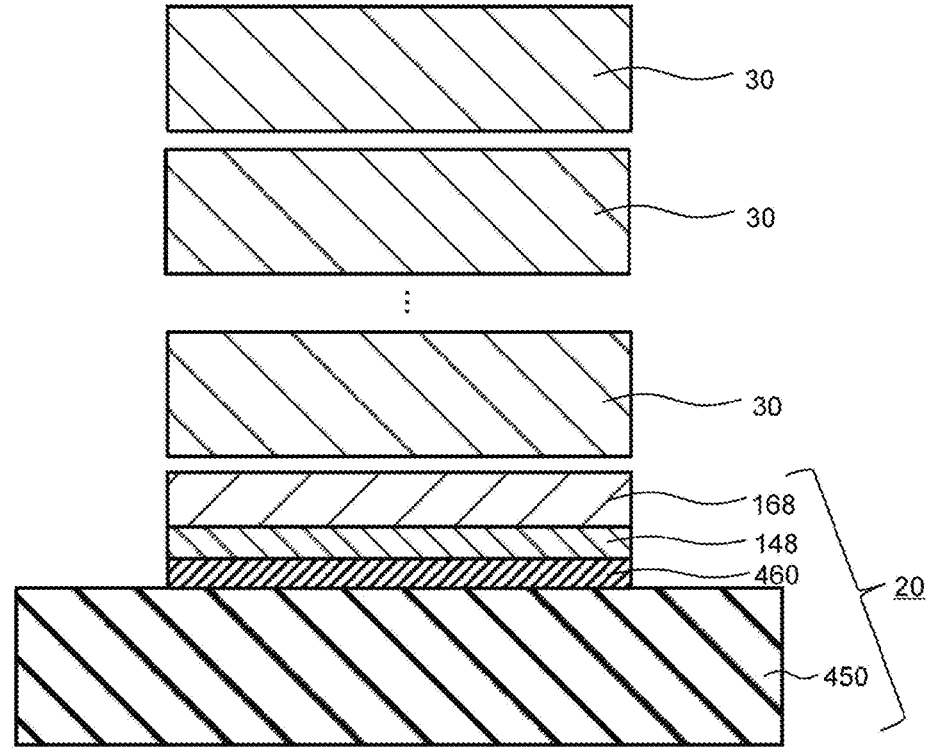
FIG. 12B is a cross-sectional view showing a state in which nitride semiconductor free-standing substrates are sliced from the full-scale growth layer in step of the modified example 5.

A method for manufacturing a nitride semiconductor free-standing substrate according to a modified example 5 will be described, with reference to FIGS. 10 to 12. FIG. 10A is a cross-sectional view showing a state in which a front side supporting substrate is attached to a front surface side of the front side semiconductor layer in step 4 of the modified example 5, and FIG. 10B is a cross-sectional view showing a state in which the back side semiconductor layer and the substrate are removed from a front surface side of the front side semiconductor layer in step 4 of the modified example 5. FIG. 11A is a cross-sectional view showing a state in which the back side supporting substrate is attached to a back surface side of the front side semiconductor layer in step 4 of the modified example 5, and FIG. 11B is a cross-sectional view showing a state in which the front side supporting substrate IS removed from the front surface side of the front side semiconductor layer in step 4 of the modified example 5. FIG. 12A is a cross-sectional view showing a state in which a full-scale growth layer is formed on the front side semiconductor layer in step 5 of the modified example 5, and FIG. 12B is a cross-sectional view showing a state in which nitride semiconductor free-standing substrates are sliced from a full-scale growth layer in step 6 of the modified example 5.

In this modified example, explanation is given for an example of manufacturing the nitride semiconductor free-standing substrate 30, by performing the following steps 4 to 6 after performing step 3 of the above-described modified example 4.

(Step 3)

The nitride semiconductor: template 18 is prepared by performing step 3 of 4 of the above-described modified example. Note that each of the back side semiconductor layer 128 and the front side semiconductor layer 168 is provided in a region excluding a predetermined non-growth region.

At this time, in advance, a diameter of the substrate 100 is set larger by the non-growth region than a desired diameter of the nitride semiconductor free-standing substrate 30 described later. Further, the front side semiconductor layer 168 is grown so that the diameter of the front side semiconductor layer 168 is made equal to or slightly larger than a desired diameter of the nitride semiconductor free-standing substrate 30. Specifically; when the nitride semiconductor free-standing substrate 30 having a diameter of 2 inches is obtained, the diameter of the substrate 100 is previously set to 2.5 inches, and the front side semiconductor layer 168 is grown so that the diameter of the front side semiconductor layer 168 is 2 inches.

Further, at this time, in the nitride semiconductor template 18 used in this modified example, for example, the thickness of the back side semiconductor layer 128 is more than 100 µm and the thickness of the front side semiconductor layer 168 is more than 100 µm. By making the thickness of the front side semiconductor layer 168 more than 100 µm, the shape of the front side semiconductor layer 168 can be stably maintained when the substrate 100 is removed from the nitride semiconductor template 18 in step 4 described later.

(Step Substrate Replacement Step)

Next, as shown in FIG. 10A, a front side supporting substrate 410 is attached to the front side semiconductor layer 168 of the nitride semiconductor template 18 interposing an adhesive layer 420. At this time, the adhesive layer 420 is, for example, wax or a double-sided tape. Further, the front side supporting substrate 410 comprises a substrate having rigidity to withstand polishing described later, for example, an alumina substrate.

Next, as shown in FIG. 10B, the back side semiconductor layer 128 and the substrate 100 are removed by grinding the nitride semiconductor template 18 from the back side semiconductor layer 128 side, with the nitride semiconductor template 18 supported on the front side supporting substrate 410. For example, the back side semiconductor layer 128 and the substrate 100 are removed by grinding using a grindstone. Note that the buffer layer 148 is not required to be removed or may be removed. Further, it is preferable that the front surface after removing the back side semiconductor layer 128 and the substrate 100 be subjected to a polishing treatment and a lapping treatment so as not to remain processing damage.

Next, as shown in FIG. 11A, the back side supporting substrate 450 is attached to the side opposite to the front side supporting substrate 410 of the front side semiconductor layer 168 (namely, the back surface side of the front side semiconductor layer 168) interposing an adhesive layer 460. At this time, the adhesive layer 460 is formed, for example, by a ceramic-based adhesive agent which is solidified by heating and turns into SiC. Thereby, the adhesive layer 460 having predetermined heat resistance and corrosion resistance can be obtained. Further, for example, the back side supporting substrate 450 comprises a material having a linear expansion coefficient close to that of the group III nitride semiconductor, and specifically, a polycrystalline GaN substrate or a finlike substrate is used as the back side supporting substrate 450. Thereby, the difference in the linear expansion coefficient between the front side semiconductor layer 168 and the back side supporting substrate 450 can be reduced, and occurrence of thermal stress between them can be suppressed in step 5 described later.

After the adhesive layer 160 is solidified and the back side supporting substrate 450 is brought into close contact with the front side semiconductor layer 168, the adhesive layer 420 and the front side supporting substrate 410 are removed, to thereby leave the front side semiconductor layer 168. After removing the adhesive layer 420 and the front side supporting substrate 410, the front surface of the front side semiconductor layer 168 is cleaned. At this time, an organic cleaning liquid such as alcohol or acetone is used as a cleaning liquid. Thereby, a residual material if the adhesive layer 420 is removed from the front surface of the front side semiconductor layer 168. In this way, the crystal growth substrate 20 having the front side semiconductor layer 168, the adhesive layer 460, and the back side supporting substrate 450 is formed.

(Step 5: Full-Scale Growth Step)

Next, as shown in FIG. 12A, a full-scale growth layer 170 comprising a monocrystalline group III nitride semiconductor is grown on the front side semiconductor layer 168 of the crystal growth substrate 20, by the same processing procedure as in step 3, using the same HVPE apparatus 200 as in step 3. Note that in step 5, it is not necessary to use the peripheral cover 360 used in step 3 of the modified example 4.

The processing condition in step 5 may be the same as the processing condition in step 3 described above, but may be a different condition. This is because in step 5, it is necessary to form the full-scale growth layer 170 thicker than the front side semiconductor layer 168 formed in step 3, and it is requested that a growth rate of the full-scale growth layer 170 in step 5 is made higher than a growth rate of the front side semiconductor layer 168 in step 3. Therefore, in step 5, it is preferable to grow the full-scale growth layer 170 under a growth condition in which crystal growth toward a normal direction (thickness direction) of the main surface of the front side semiconductor layer 168 is more active than crystal growth in step 3.

As a method for achieving the above-described object, for example, there is a method of making the atmosphere in the film formation chamber 201 in step 5 different from the atmosphere in Step 3. For example, the ratio ($N_2/H_2$) of a partial pressure of the $N_2$ gas with respect to a partial pressure of the $H_2$ gas in the film formation chamber 201 in step 5 is larger than the ratio ($N_2/H_2$) of a partial pressure of the $N_2$ gas with respect to a partial pressure of the $H_2$ gas in the film formation chamber 201 in the step 3. Thereby, in step 5, the crystal growth toward the normal direction of the main surface of the front side semiconductor layer 168 becomes more active than the crystal growth in step 3.

Further, as a method of achieving the above-described object, for example, there is a method of making the growth temperature in step 5 different from the growth temperature in step 3. For example, a film forming temperature in step 5 is set to be lower than a film forming temperature in step 3. Thereby as well, in step 5, the crystal growth toward the normal direction of the main surface of the front side semiconductor layer 168 becomes more active than the crystal growth in step 3.

Further, as a method of achieving the above-described object, for example, there is a method of making the ratio ($NH_3/GaCl$, so-called V/III ratio) of the supply flow rate of the $NH_3$ gas to the supply flow rate of the GaCl gas in step 5 different from that in Step 3. For example, the $NH_3/GaCl$ ratio in step 5 is set so as to be larger than the $NH_3/GaCl$ ratio in step 3. Thereby as well, in step 5, the crystal growth toward the normal direction of the main surface of the front side semiconductor layer 168 becomes more active than the crystal growth in step 3.

Further, as a method of achieving the above-described object, for example, there is a method of making a supply flow rate of GaCl gas in step 5 different from that in step 3. For example, GaCl flow rate in step 5 is set to be larger than GaCl flow rate in step 3. Thereby as well, in step 5, the crystal growth toward the normal direction of the main surface of the front side semiconductor layer 168 becomes more active than the crystal growth in step 3.

(Step 6: Nitride Semiconductor Free-Standing Substrate Manufacturing Step)

Next, as shown in FIG. 12B, the nitride semiconductor free-standing substrate 30 having a predetermined thickness is fabricated by slicing (cutting out) the full-scale growth layer 170 obtained in step 5 (or the front side semiconductor layer 168) perpendicularly to the thickness direction (crystal growth direction) and at equal intervals along the thickness direction.

For slicing the full-scale growth layer 170, for example, a wire saw is used. In this case, the nitride semiconductor free-standing substrate 30 is sliced while applying a loose grind stone (abrasive liquid) to a wire traveling along a slice position of the full-scale growth layer 170. Alternatively, so-called fixed abrasive grains in which the wire itself holds abrasive grains, may be used in place of the loose grindstone.

Thereafter, processing such as outline processing, chamfering, polishing, and cleaning is performed to the sliced nitride semiconductor free-standing substrate 30. At this time, at least the front surface of the nitride semiconductor free-standing substrate 30 is mirror polished. Note that both surfaces of the nitride semiconductor free-standing substrate 30 may be mirror polished.

As described above, the nitride semiconductor free-standing substrate 30 of this embodiment is manufactured.

Note that the crystal growth substrate 20 remaining after slicing the nitride semiconductor free-standing substrate 30 may be used again to re-grow the full-scale, growth layer 170. Thereby, a manufacturing cost of the nitride semiconductor free-standing substrate 30 can be reduced.

According to the modified example 5, the crystal growth substrate 20 can be formed by removing the back side semiconductor layer 128 and the substrate 100 from the nitride semiconductor template 18 obtained in the above-described modified example and leaving the front side semiconductor layer 168. Thereby, thermal stress caused by a difference in the linear expansion coefficient between the substrate 100 and the front side semiconductor layer 168 can be prevented from occurring in the crystal growth substrate 20. Namely, it is possible to stably grow a thick full-scale growth layer 170 on the crystal growth substrate 20 in a thermal stress free state. As a result, many nitride semiconductor free-standing substrates 30 can be sliced from the full-scale growth layer 170, and production efficiency of the nitride semiconductor free-standing substrate 30 can be improved.

Further, according to the modified example 5, in the nitride semiconductor template 18 obtained in the modified example 4, since the thickness of the front side semiconductor layer 168 is increased and dislocation density thereof is lowered, the dislocation density of the full-scale growth layer 170 grown on the front side semiconductor layer 168 of the crystal growth substrate 20 can also be lowered. As a result, it is possible to obtain a high-quality nitride semiconductor free-standing substrate 30 from the full-scale growth layer 170.

Further, according to the modified example 5, since the back side semiconductor layer 128 is polycrystalline, the back side semiconductor layer 128 can be easily ground when the back side semiconductor layer 128 and the substrate 100 are removed by grinding in step 4. As a result, it is possible to shorten processing time required in step 4.

Note that in the above-described modified example 5, explanation is given for a case in which the back side supporting substrate 450 is attached to the back surface side of the front side semiconductor layer 168 to form the crystal growth substrate 20, after removing the back side semiconductor layer 128 and the substrate 100 from the nitride semiconductor template 18 in step 4. However, when the front side semiconductor layer 168 is thick and free-standing by itself, the front side semiconductor layer 168 may be made self-standing to be a nitride semiconductor free-standing substrate, without attaching the back side supporting substrate 450 to the back surface side of the front side semiconductor layer 168. Further, the full-scale growth process of step 5 may be preformed using a nitride semiconductor free-standing substrate comprising only the front side semiconductor layer 168 as a crystal growth substrate.

Other Embodiments

As described above, embodiments of the present invention have been specifically described. However, the present invention is not limited to the above-described embodiments, and various modifications can be made without departing from the gist thereof.

In the above-described embodiment, explanation is given for a case in which the substrate 100 is a sapphire substrate, but the substrate 100 may he a silicon carbide (SiC) substrate or the like.

In the above-described embodiment and modified example 1, etc., explanation is given for a case in which the back surface 101 of the substrate 100 is a rough surface having random irregularities. However, for example, when the back side semiconductor layer 120 is formed on the back surface 101 of the substrate 100 without a buffer layer as described above, the back surface 101 of the substrate 100 may be a mirror surface, because the back side semiconductor layer 120 can be polycrystalline by this manufacturing method.

In the above-described embodiment, explanation is given for a case in which the back side semiconductor layer 120 comprises GaN. However, the back side semiconductor layer 120 may comprise a group III nitride semiconductor other than GaN, and for example, a group III nitride semiconductor such as AlN, aluminum gallium nitride (AlGaN), indium nitride (InN), indium gallium nitride (InGaN), aluminum indium gallium nitride (AlInGaN), that is, a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiment, explanation is given for a case in which the front side semiconductor layer 160 comprises GaN. However, the front side semiconductor layer 160 may comprise a group 111 nitride semiconductor other than GaN, for example, a group III nitride semiconductor such as AlN, AIGaN, InN, InGaN, AlInGaN, that is, a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiment, explanation is given for a case in which the back side semiconductor layer 120 and the front side semiconductor layer 160 comprise the same group III nitride semiconductor. However, the back side semiconductor layer 120 and the front side semiconductor layer 160 may comprise different group III nitride semiconductors each other. However, in this case, the ratio of the thicknesses of the back side semiconductor layer 120 and the front side semiconductor layer 160 needs to be appropriately set in consideration of the linear expansion coefficient of each material.

In the above-described embodiment explanation is given for a case in which the buffer layer 140 comprises AlN. However, the buffer layer 140 may comprise a group III nitride semiconductor other than AlN, for example, a group III nitride semiconductor such as GaN, AlGaN, InN, InGaN, and AlInGaN, that is, a group III nitride semiconductor represented by a composition formula $Al_xIn_yGa_{1-x-y}N$ ($0 \leq x \leq 1$, $0 \leq y \leq 1$, $0 \leq x+y \leq 1$). Further, the growth temperature of the buffer layer 140 is set, to be approximately 1000 to 1100° C. which is substantially the same as that of the front side semiconductor layer 160. However, the buffer layer 140 may be a low temperature growth layer of 400 to 600° C.

In the above-described embodiment, explanation is given for a case in which the film forming gas is flowed in a direction crossing the main surface of the substrate 100 (a direction oblique to the main surface) in the HVPE apparatus 200, however, the film forming gas may flow in a direction along the main surface of the substrate 100 (a direction parallel to the main surface) or in a direction perpendicular to the main surface of the substrate 100.

In the above-described embodiment, explanation is given for a case in which the substrate 100 is placed on the susceptor 208 interposing the ring-like spacer 310 or the plate-like spacer 320, in step 2, however, if the front surface 102 side of the substrate 100 can be protected, it is not necessary to use the ring-like spacer 310 or the plate-like spacer 320. For example, a groove portion having an area slightly smaller than the area of the front surface 102 of the substrate 100 is formed in the pocket. 208p of the susceptor 208, and the substrate 100 may be placed on the susceptor 208 so as to cover the groove portion by the front surface 102 side of the substrate 100. Thereby, the front surface 102 side of the substrate 100 can be protected.

In the above-described embodiment, explanation is given for a case in which the growth temperature of the back side semiconductor layer 120 in step 2 is made equal to the growth temperature of the front side semiconductor layer 160 in step 3. However, the growth temperature of the back side semiconductor layer 120 in step 2 may be different from the growth temperature of the front side semiconductor layer 160 in step 3. For example, the growth temperature of the back side semiconductor layer 120 in step 2 may be lower than the growth temperature of the front side semiconductor layer 160 in step 3. For example, this case corresponds to a case in which the backside semiconductor layer 120 is formed by a sputtering method which has a merit such as high productivity and no toxic gas. In this case, the back side semiconductor layer 120 is in an amorphous state. In this case as well, at the time of temperature rise in the case of forming the monocrystalline front side semiconductor layer 160 at high temperature (for example 1000° C.) on the front surface 102 side of the substrate 100 in step 3 after an amorphous back side semiconductor layer 120 is formed at low temperature (for example, 500° C.) on the back surface 101 side of the substrate 100 in step 2, most of the amorphous backside semiconductor layer 120 is polycrystallized. When the amorphous back side semiconductor layer 120 is polycrystallized, the stress between the crystal constituting the back side semiconductor layer 120 and the substrate 100 is relaxed. Therefore, in this case as well, it is possible in obtain the substrate 100 provided with the polycrystalline back side semiconductor layer 120 on the back surface 101 side, similar to the substrate 100 obtained in step 2 of the above-described embodiment, and it is possible to substantially eliminate warping when heated to the growth temperature of the front side semiconductor layer 160. Note that in this case, although a part of the amorphous crystal may remain in the back side semiconductor layer 120, a stress is generated, which is the stress equivalent to that of the back side semiconductor layer 120 which is entirely polycrystallized due to high temperature formation.

In the above-described embodiment explanation is given for a case in which the back side semiconductor layer 120 or the front side semiconductor layer 160 is formed by using the HVPE apparatus 200 in step 2 or 3. However, a Metal-Organic Vapor Phase Epitaxy (MOVPE) apparatus, or a Molecular Beam Epitaxy (MBE) apparatus may also be used. However, it is preferable to use the HVPE apparatus because the growth rate of the back side semiconductor layer 120 or the front side semiconductor layer 160 can be increased.

In the above-described embodiment explanation is given for a case in which the diameter of the substrate 100 is 4 inches and the thickness of the substrate 100 is 900 µm. However, the diameter and the thickness of the substrate 100 are not limited thereto. For example, the substrate 100 may be, for example, a 4-inch substrate with a thickness of 650 µm, a 2-inch substrate with a thickness of 300 µm or 450 µm (50.8 mm in diameter), a 6-inch substrate with a thickness of 1300 µm (150 mm in diameter). In this case as well, it is possible to obtain the same effect as the above-described embodiment.

EXAMPLES

Hereinafter, various experimental results which support the effect of the present invention will be described.

(1) Regarding a Back Surface Growth Sample

"Back surface growth sample" in which only the back side semiconductor layer was provided on the back surface side of the substrate was manufactured, and various evaluations were conducted. Namely, the back surface growth sample corresponds to the substrate whose growth has been completed in step 2. Representative examples among them are shown in Table 1 below.

TABLE 1

|  | Back side growth 1 | Back side growth 2 | Back side growth 3 | Back side growth 4 | Back side growth 5 | Back side growth 6 | Back side growth 7 | Back side growth 8 |
|---|---|---|---|---|---|---|---|---|
| Back side semiconductor layer(µm) | 21 | 30 | 45 | 60 | 110 | 110 | 150 | 180 |
| Peripheral cover | Absent | Absent | Absent | Absent | Absent | Present | Present | Present |
| Crack | ◯ | ◯ | ◯ | ◯ | X | ◯ | ◯ | ◯ |
| Warping amount(µm) | −180 | −267 | −380 | −521 | — | −950 | −1310 | −1550 |

(1-1) Manufacture of the Back Surface Growth Sample

In back surface growth samples 1 to 8, a sapphire substrate having a diameter of 4 inches, a thickness of 900 µm, a surface inclined at 0.3° in the M-axis direction of sapphire from c-plane, was used as a substrate. The back surface of the substrate was a rough surface having random irregularities.

Further, in the back surface growth samples 1 to 8, first, a back side semiconductor layer comprising polycrystalline GaN was directly formed on the back surface side of the substrate without interposing a buffer layer. At this time, the growth temperature of the back side semiconductor layer was set to 1050° C. Also, at this time, the thickness of the back side semiconductor layer was set to 21 to 180 µm.

At this time, in the back surface growth samples 1 to 5, a back side semiconductor layer was formed, with a configuration of FIG. 3B or FIG. 3C, without using the peripheral cover. Meanwhile, in back surface growth samples 6 to 8, the back side semiconductor layer was formed, with the configuration of FIG. 9A, using the peripheral cover. Note that the width of the non-growth region in the back surface growth samples 6 to 8 was set to 2 mm.

(1-2) Evaluation of the Back Surface Growth Sample (Warping Amount)

A warping amount of each back surface growth sample at room temperature was measured, using a laser displacement gauge. Note that the "warping amount of the back surface growth sample" was obtained as a difference between a height of the central portion and a height of the peripheral edge portion of the back surface growth sample, by measuring from the front surface of the substrate. Note that positive warping amount means a case in which the front surface side of the substrate is convex, and minus warping amount means a case in which the front surface side of the substrate is concave.

(Crack)

At room temperature (25° C.), presence or absence of cracks in the back surface growth sample was examined visually and using an optical microscope. A sample in which cracks were not generated in the back surface growth sample was evaluated as "○ (circle)", and a sample in which cracks were generated in at least a part of the back surface growth sample was evaluated as "x".

(1-3) Result of the Back Surface Growth Sample

As shown in Table 1, the back surface growth samples 1 to 8 were warped so that the front surface side was concave, and the warping amount was minus. Further, in the back surface growth samples 1 to 8, as the thickness of the back side semiconductor layer became larger, an absolute value of the warping amount of the back surface growth sample became larger.

Next, the effect of the peripheral cover during the formation of the back side semiconductor layer will be described in back surface growth samples 1 to 4 in which the thickness of the back side semiconductor layer was 50 μm or less, cracks did not occur in the back surface growth samples even without using the peripheral cover. However, in the back surface growth sample 5 or the like in which the thickness of the backside semiconductor layer was more than 60 μm without using the peripheral cover, the ratio of cracking during growth of the back side semiconductor layer was increased, and it was difficult to stably obtain the back surface growth sample in which the back side semiconductor layer was formed on the back surface side of the substrate. Meanwhile, the back surface growth samples 6 to 8 in which the thickness of the backside semiconductor layer was more than 60 μm using the peripheral cover, it was confirmed that the back surface growth samples could be stably obtained, with cracks suppressed. Namely, it was confirmed that since the back side semiconductor layer was provided, with a space from the peripheral edge portion of the back surface of the substrate using the peripheral cover, the occurrence of cracks in the back surface growth samples could be suppressed, even when the thickness of the back side semiconductor layer was large.

Although not shown in Table 1, the back surface growth sample was manufactured, with a width of a region (non-growth region) changed, where the peripheral cover covers the back surface side of the substrate. According to a result thereof, in the back surface growth sample in which the width of the non-growth region of the back side semiconductor layer was less than 0.5 mm, although certain effects to suppress cracks were observed, it was difficult to completely suppress the occurrence of cracks. Probably this is because GaN is adhered to the side surface of the substrate at a certain rate depending on processing tolerance of the peripheral cover or susceptor, tolerance of the diameter of the substrate, etc. In contrast, it was confirmed that in the back surface growth sample in which the width of the non-growth region of the back side semiconductor layer was 0.5 mm or more (5 mm or less), the back surface growth sample could be stably obtained, with cracks suppressed. Accordingly, it was also confirmed that: in order to stably suppress the cracks at the time of forming the back side semiconductor layer when the thickness of the back side semiconductor layer was large, it was preferable to use the peripheral cover and set the width of the region to 0.5 mm or more, where the peripheral cover covers the back surface side of the substrate.

(2) Regarding the Nitride Semiconductor Template Sample

Next, the nitride semiconductor template sample was manufactured and evaluated variously. Representative examples among them are shown in Tables 2 and 3 below. The nitride semiconductor template sample may be simply referred to as a "sample" hereafter.

TABLE 2

|  | 1 | 2 | 3 | 4 | 5 | 6 | 7 |
|---|---|---|---|---|---|---|---|
| Front side semiconductor layer (μm) | 9 | 10 | 14 | 15 | 19 | 20 | 25 |
| Back side semiconductor layer (μm) | Absent | Absent | Absent | Absent | Absent | Absent | Absent |
| Step 3 (front surface) peripheral cover | Absent | Absent | Absent | Absent | Absent | Absent | Absent |
| Step 2 (back surface) peripheral cover | — | — | — | — | — | — | — |
| Warping amount (μm) | 90 | 100 | 140 | 150 | 190 | — | — |
| Crack at the time of temperature rise | ○ | X | X | X | X | — | — |
| After elapse of 24 hours after formation | ○ | ○ | ○ | X | X | — | — |
| Immediately after formation | ○ | ○ | ○ | ○ | ○ | X | X |
| Dislocation density ($10^{-7}$ cm$^{-2}$) | 10 | 10 | 9 | 9 | 8 | — | — |
| Transmittance (wavelength 550 nm) | X | X | X | X | X | X | X |
| Transmittance (wavelength 2 μm) | X | X | X | X | X | X | X |

TABLE 3

|  | 8 | 9 | 10 | 11 | 12 | 13 | 14 | 15 | 16 | 17 |
|---|---|---|---|---|---|---|---|---|---|---|
| Front side semiconductor layer (μm) | 11 | 16 | 21 | 21 | 42 | 50 | 110 | 110 | 110 | 150 |
| Back side semiconductor layer (μm) | 11 | 16 | 21 | 30 | 50 | 60 | 110 | 110 | 150 | 180 |
| Step 3 (front surface) peripheral cover | Absent | Absent | Absent | Absent | Absent | Absent | Absent | Present | Present | Present |
| Step 2 (back surface) peripheral cover | Absent | Absent | Absent | Absent | Absent | Absent | Present | Present | Present | Present |
| Warping amount (μm) | 50 | 45 | 40 | −30 | 30 | 25 | — | 210 | −110 | 50 |
| Crack at the time of temperature rise | ○ | ○ | ○ | ○ | ○ | ○ | — | ○ | ○ | ○ |
| After elapse of 24 hours after formation | ○ | ○ | ○ | ○ | ○ | ○ | — | ○ | ○ | ○ |
| Immediately after formation | ○ | ○ | ○ | ○ | ○ | ○ | X | ○ | ○ | ○ |
| Dislocation density ($10^{-7}$ cm$^{-2}$) | 8 | 6 | 5 | 5 | 1.5 | 0.9 | — | 0.6 | 0.6 | 0.3 |
| Transmittance (wavelength 550 nm) | ○ | ○ | ○ | ○ | ◎ | ◎ | ◎ | ◎ | ◎ | ◎ |
| Transmittance (wavelength 2 μm) | ○ | ○ | ○ | ○ | ◎ | ◎ | ◎ | ◎ | ◎ | ◎ |

(2-1) Manufacture of the Nitride Semiconductor Template Sample

In samples 1 17, a sapphire substrate having a diameter of 4 inches, a thickness of 900 μm, a surface inclined at 0.3° in the M-axis direction of sapphire from c-plane, was used as a substrate. The back surface of the substrate was a rough surface having random irregularities.

In samples 1 to 7, a buffer layer made of AlN was formed using the HVPE apparatus, on the front surface side of the substrate without growing a polycrystalline GaN layer on the back surface side of the substrate as a back side semiconductor layer. At this time, the growth temperature of the buffer layer was 1050° C., and the thickness of the buffer layer was 200 nm. Next, a front side semiconductor layer comprising monocrystalline GaN was formed on the buffer layer. At this time, the growth temperature of the front side semiconductor layer was 1050° C. which is the same as that of the AlN buffer layer, and the thickness of the front side semiconductor layer was 9 to 25 μm.

In samples 8 to 17, first, a back side semiconductor layer comprising polycrystalline GaN was directly formed using the HVPE apparatus, on the back surface side of the substrate without interposing the buffer layer. At this time, the growth temperature of the back side semiconductor layer was 1050° C. and the thickness of the back side semiconductor layer was 11 to 180 μm. Next, as in samples 1 to 4, a buffer layer comprising AlN was formed on the front surface side of the substrate. At this time, the growth temperature of the buffer layer was 1050° C., and the thickness of the buffer layer was 200 nm. Next a front side semiconductor layer comprising monocrystalline GaN was formed on the buffer layer. At this time, the growth temperature of the front side semiconductor layer was 1050° C. which is the same as that of the AlN buffer layer, and the thickness of the front side semiconductor layer was 11 to 150 μm. The peripheral cover was used at the time of forming the back side semiconductor layer in sample 14, and at the time of forming the back side semiconductor layer and at the time of forming the front side semiconductor layer in samples 15 to 17. At this time, the width of the region (non-growth region) was 2 mm, where each peripheral cover covers the main surface of the substrate.

At the time of forming the front side semiconductor layer in samples 1 to 17 (step 2), the following growth method was adopted in order to achieve sufficiently low dislocation density of the front side semiconductor layer. A growth condition of not flattening the surface was adopted until the thickness of the front side semiconductor layer readied about 60% of a final thickness, and the growth condition was switched to a growth condition for flattening the surface when the thickness of the front side semiconductor layer exceeded about 60% of the final thickness. Specifically, as the final thickness of the front side semiconductor layer was larger, the growth rate at the initial stage of growth (corresponding to a thickness of 5 μm or less) was made lower. As the growth rate becomes lower, the density of the nuclei being formed on the buffer layer at the initial stage of the growth becomes lower, and an effect of delaying the flattening of the surface is increased. Specifically, when the final thickness of the front side semiconductor layer was less than 20 μm, the growth rate at the initial stage of the growth was 1 μm/min, and when the final thickness of the front side semiconductor layer was 20 μm or more and less than 50 μm, the growth rate in the initial stage of growth was 0.6 μm/min, and when the final thickness of the front side semiconductor layer was 50 μm or more, the growth rate at the initial stage of growth was 0.3 μm/min. Further, a condition for obtaining a growth rate of 2 μm/min was adopted as the growth condition for flattening the surface of the front side semiconductor layer at the stage when the thickness of the front side semiconductor layer exceeded about 60% of the final thickness.

(2-2) Evaluation of the Nitride Semiconductor Template Sample (Warping Amount)

The warping amount of the nitride semiconductor template was evaluated by the same evaluation method as that of the hack surface growth sample.

(Crack)

Presence or absence of cracks in the front side semiconductor layer was visually inspected, in each of the case when the nitride semiconductor template was heated again to the growth temperature of GaN (1050° C.) after the nitride semiconductor template was manufactured (described as "at the time of temperature rise" in the Table), the case after elapse of 24 hours after formation of the front side semiconductor layer (described as "after 24 hours from formation" in the Table), or the case immediately after formation of the front side semiconductor layer (described as "immediately after formation" in the Table). A sample in which no cracks were generated in the nitride semiconductor template was evaluated as "o (circle)", and a sample in which cracks were generated in at least a part of the nitride semiconductor template was evaluated as "x".

(Dislocation Density)

A cathode luminescence image of the surface of the nitride semiconductor template was observed, and the number of dark spots observed at that time was measured and the number of dark spots per unit area was taken as the dislocation density.

(Transmittance)

As an evaluation corresponding to the visibility, the transmittance of the nitride semiconductor template in a visible range was measured. The visibility was evaluated as "⊚ (double circle)" when the transmittance at a wavelength of 550 nm was 0% or more and less than 30%, and the visibility was evaluated as "o (circle)" when the transmittance at a wavelength of 550 nm was 30% or more and less than 60%, and the visibility was evaluated as "x" when the transmittance, at a wavelength of 550 nm was 60% or more.

As an evaluation corresponding to heat absorption, the transmittance of the nitride semiconductor template in an infrared region was measured. The heat absorption was evaluated as "⊚ (double circle)" when the transmittance at a wavelength of 2 μm was 0% or more and less than 30%, and the heat absorption was evaluated as "o (circle)" when the transmittance at a wavelength of 2 μm was 30% or more and less than 60%, and the heat absorption was evaluated as "x" when the transmittance at a wavelength of 2 μm was 60% or more.

(2-3) Result of the Nitride Semiconductor Template Sample

An evaluation result of the nitride semiconductor template sample will be described using Tables 2 and 3.

(Effects of the Back Side Semiconductor Layer)

First, the effect of the back side semiconductor layer will be described.

In samples 1 to 5 in which only the front side semiconductor layer was formed without forming the back side semiconductor layer, an absolute value of the warping amount of the nitride semiconductor template was increased as the thickness of the front side semiconductor layer was increased. Namely, it was confirmed that the internal stress in the front side semiconductor layer was increased as the thickness of the front side semiconductor layer was increased, due to a difference in linear expansion coefficient between the substrate and the front side semiconductor layer. In samples 6 and 7, cracks were generated in the front side semiconductor layer as described later, and therefore an accurate warping amount could not be measured.

In sample 1 in which the thickness of the front side semiconductor layer was 9 μm without forming the back side semiconductor layer, no cracks were generated in each of the case at the time of temperature rise, the case after elapse of 21 hours after formation, or the case immediately after formation. However, in sample 2 in which the thickness of the front side semiconductor layer was 10 μm without forming the back side semiconductor layer, cracks were generated in the front side semiconductor layer at the time of temperature rise. Namely, it was confirmed that the first critical thickness was 10 μm at which cracking occurs in the front side semiconductor layer at the time of temperature rise in a case that only the front side semiconductor layer was formed without forming the back side semiconductor layer.

Further, in sample 3 in which the thickness of the front side semiconductor layer was 14 μm without brining the back side semiconductor layer, no cracking was generated each of the case after elapse of 24 hours after formation or the case immediately after formation. However, in sample 4 in which the thickness of the front side semiconductor layer was 15 μm without forming the back side semiconductor layer, cracks were generated in the front side semiconductor layer after elapse of 24 hours after formation. Namely, it was confirmed that the second critical thickness was 15 μm, at which cracks were generated in the front side semiconductor layer after elapse of 24 hours from formation in a case that only the front side semiconductor layer is formed without forming the back side semiconductor layer.

Further, in sample 5 in which the thickness of the front side semiconductor layer was 19 μm without forming the back side semiconductor layer, no cracks were generated in the case immediately after formation. However, in samples 6 and 7 in which the thickness of the back side semiconductor layer was 20 μm or more without forming the back side semiconductor layer, cracks were generated in the front side semiconductor layer immediately after formation. Namely, it was confirmed that the third critical thickness was 20 μm, at which cracks were generated in the front side semiconductor layer immediately after formation in a case that only the front side semiconductor layer is formed without forming the back side semiconductor layer. In such a situation in which cracks are generated in the front side semiconductor layer immediately after formation of the front side semiconductor layer, it is not possible to adopt the method of Non-Patent Document 1 (a method of forming a back side semiconductor layer after forming a front side semiconductor layer) using a nitride semiconductor template such as Samples 6 and 7.

In contrast, in sample 8 in which both the back side semiconductor layer and the front side semiconductor layer were provided and the thickness of the front side semiconductor layer was 11 μm, it was confirmed that no cracks were generated in each of the case at the time of temperature rise, the case after elapse of 24 hours after formation, or the case immediately after formation. It was also confirmed that the warping amount was within ±100 μm in sample 8. Namely, it was confirmed that since the back side semiconductor layer was provided and the internal stress of the front side semiconductor layer was canceled by the internal stress of the back side semiconductor layer, generation of the cracks on the front side semiconductor layer could be suppressed when the nitride semiconductor template was heated to the growth temperature of GaN, and warping of the nitride semiconductor template could be reduced, even if the thickness of the front side semiconductor layer was more than the first critical thickness.

Further, in Sample 9 in which both the back side semiconductor layer and the front side semiconductor layer were provided and the thickness of the front side semiconductor layer was 16 μm, it was confirmed that no cracks were generated in each of the case at the time of temperature rise, the case after elapse of 24 hours after formation, or the case immediately after formation. Further, in sample 9, it was confirmed that the warping amount was within ±100 μm. Namely, it was confirmed that since the back side semiconductor layer was provided and the internal stress of the front side semiconductor layer was canceled by the internal stress of the back side semiconductor layer, generation of the cracks on the front side semiconductor layer after elapse of 24 hours after formation of the front side semiconductor layer could be suppressed, and the warping of the nitride semiconductor template could be reduced, even if the thickness of the front side semiconductor layer was more than the second critical thickness.

Further, in samples 10 to 13 in which both the back side semiconductor layer and the front side semiconductor layer were provided and the thickness of the front side semiconductor layer was more than 20 μm, it was confirmed that no cracks were generated in each of the case at the time of temperature rise, the case after elapse of 24 hours after formation, or the case immediately after formation. Further, in samples 10 to 13, it was confirmed that the warping amount was within ±100 μm. Namely, it was confirmed that since the back side semiconductor layer was provided and the internal stress of the front side semiconductor layer was canceled by the internal stress of the back side semiconductor layer, generation of the cracks in the front side semiconductor layer immediately after formation of the front side semiconductor layer could be suppressed, and the warping of the nitride semiconductor template could be reduced, even if the thickness of the front side semiconductor layer was more than the third critical thickness.

It was also confirmed that when the thickness of the front side semiconductor layer was 50 μm or less as in samples 10 to 13, the warping amount could he within ±100 μm, and cracks were not generated either, even without using the peripheral cover.

In samples 10 and 11, the thickness of the front side semiconductor layer is 21 μm and the thickness of the hack side semiconductor layer is 21 and 30 μm, respectively. In this case, the warping amounts were +40 μm and −30 μm, respectively in samples 10 and 11. Accordingly, it was confirmed that by adjusting the thickness of the back side semiconductor layer, the warping amount of a final nitride semiconductor template could be controlled.

(Regarding the Effect of the Peripheral Cover)

The effect of the peripheral cover will he described next.

Although not shown in Table 2, in samples 6 and 7 in which only the front side semiconductor layer was formed without forming the back side semiconductor layer, a case of using the peripheral cover when forming the front side semiconductor layer was separately studied. However, in this case as well, generation of the cracks could not be suppressed. Since the front side semiconductor layer is formed as being monocrystalline and has cleavage properties, it can be considered that cracks are likely to generate along a specific cleavage direction.

In sample 14 in which a predetermined back side semiconductor layer was provided, the thickness of the front side semiconductor layer was more than 50 μm (110 μm), and no peripheral cover was used in forming the front side semiconductor layer, cracks were generated in the nitride semiconductor template immediately after formation. It can be considered that cracks are likely to generate in the nitride semiconductor template, mainly due to uneven stress distribution at the peripheral edge of the substrate, chipping of the peripheral edge portion of the substrate, or the like.

In contrast, in samples 15 to 17 in which a predetermined back side semiconductor layer was provided, the thickness of the front side semiconductor layer was more than 50 μm, and the peripheral cover was used at the time of forming the back side semiconductor layer and at the time of forming the front side semiconductor layer, no cracks were generated in the nitride semiconductor template. Particularly in sample 15, even though the thickness of the back side semiconductor layer and the thickness of the front side semiconductor layer were equal to that of the sample 14, cracks were not generated. From this fact, it was confirmed that a crack suppression effect could be obtained by using the peripheral cover when forming the front side semiconductor layer. Namely, since the front side semiconductor layer was provided, with a space from the peripheral edge portion of the surface of the substrate using the peripheral cover, generation of the cracks in the nitride semiconductor template could be suppressed even when the thickness of the front side semiconductor layer was large.

(Regarding the Warping Amount in the Case of a Thick Film)

Next, the warping amount in the case of a thick Ma (when the peripheral cover is used) will be described.

In sample 15 in which the thickness of the back side semiconductor layer was 110 μm and the thickness of the front side semiconductor layer was 110 μm, the nitride semiconductor template was warped so that the front side was convex, and its warping amount was more than 200 μm. This is because the thickness of the back side semiconductor layer and the thickness of the front side semiconductor layer are equal to each other. Namely, in sample 15, it was considered that the nitride semiconductor template was warped so that the front side was convex, because the internal stress of the monocrystalline front side semiconductor layer was larger than the internal stress of the polycrystalline back side semiconductor layer. Meanwhile, in sample 16 in which the thickness of the back side semiconductor layer was 150 μm and the thickness of the front side semiconductor layer was 110 μm, the nitride semiconductor template was warped so that the front side was concave, and its warping amount was −110 μm. From these facts, when the thickness of the front side semiconductor layer is 110 μm equal to the thickness of the front side semiconductor layer in samples 15 and 16, by setting the thickness of the back side semiconductor layer to 130 to 140 μm, the warping amount of the nitride semiconductor template can be within ±100 μm. This is confirmed in another experiment which is not actually shown in Tables 2 and 3.

Further, in sample 17 in which the thickness of the back side semiconductor layer was 180 μm and the thickness of the front side semiconductor layer was 150 μm, the warping amount of the nitride semiconductor layer was suppressed to be small (50 μm), despite an extremely large thickness of the front side semiconductor layer.

As described above, it was confirmed that by appropriately adjusting the thickness of the back side semiconductor layer within a range in which the thickness of the back side semiconductor layer is not less than the thickness of the front side semiconductor layer, the internal stress of the front side semiconductor layer could be canceled by the internal stress of the back side semiconductor layer and the warping amount could be reduced.

(Regarding a Dislocation Density)

A dislocation density will be described next.

In samples 6 and 7 in which the back side semiconductor layer was not provided and the thickness of the front side semiconductor layer was more than 20 μm as described above, cracks were generated in the nitride semiconductor template as described above. Therefore, when the back side semiconductor layer was not provided, the thickness of the front side semiconductor layer could not be increased due to generation of the cracks, and the dislocation density of the front side semiconductor layer could not be lowered to $5 \times 10^7$ cm$^{-2}$ or less.

In contrast, in samples 10 to 13, and 15 to 17 in which a predetermined back side semiconductor layer was provided and the thickness of the front side semiconductor density was more than 20 μm, it was confirmed that the dislocation density became $5 \times 10^7$ cm$^{-2}$ or less and the dislocation density was lowered as the thickness of the front side semiconductor layer was increased. Particularly in samples 13 and 15 to 17 in which the thickness of the front side semiconductor layer was 50 μm or more, it was confirmed that the dislocation density was less than $1 \times 10^7$ cm$^{-2}$. Namely, it was confirmed that low dislocation density equivalent to that of GaN free-standing substrate could be realized in the nitride semiconductor template in which the sapphire substrate was used.

(Regarding Visibility and Heat Absorption)

Visibility and heat absorption will be described next.

In samples 1 to 7 in which the back side semiconductor layer was not provided, the front side semiconductor layer was monocrystalline, and therefore the transmittance at a wavelength of 550 nm was high and good visibility was not obtained. Further, the transmittance at a wavelength of 2 μm was high, and good heat absorption was not obtained.

In contrast, in samples 8 to 17 in which a predetermined back side semiconductor layer was provided, it was confirmed that the transmittance at a wavelength of 550 nm was low and good visibility could be obtained. Further, in samples 8 to 17, the transmittance at a wavelength of 2 μm was low. Further, in samples 8 to 17, in raising the temperature of the substrate from room temperature to the growth temperature (1050° C.) in the step (step 3) of forming the front side semiconductor layer, it took 110 minutes for stabilizing the temperature of the substrate, which was shorter than the time (120 minutes) in samples 1 to 7 in which the back side semiconductor layer was not provided. From these facts, in samples 8 to 17, it was confirmed that since the back side semiconductor layer was provided, heat absorption property could be improved. Particularly, in samples 12, 13, and 15 to 17 in which the thickness of the back side semiconductor layer was 50 μm or more, the transmittance at a wavelength of 550 nm was 30% or less, and it was confirmed that visibility could be more reliably improved. Further, in samples 12, 13, and 15 to 17, in raising the temperature of the substrate from room temperature to the growth temperature (1050° C.) in the step (step 3) of forming the front side semiconductor layer, it took 90 minutes or less for stabilizing the temperature of the substrate and it was possible to raise the temperature in a further shorter time From these facts, in samples 12, 13, and 15 to 17, it was confirmed that by increasing the thickness of the back side semiconductor layer, the heat, absorption property could be more reliably improved.
(Regarding the Width of the Peripheral Cover)

The width of the region (non-growth region) where t peripheral cover covers the main surface of the substrate will be described next.

Although not described in Tables 2 and 3, the nitride semiconductor template was manufactured, in which the thickness of the back side semiconductor layer and the thickness of the front side semiconductor layer were more than 50 µm, and the width of the region (non-growth region) where the peripheral cover covers the main surface of the substrate was changed.

Regarding the width of the non-growth region of the back side semiconductor layer, it was confirmed that since the width of the non-growth region of the back side semiconductor layer was 0.5 mm or more as described in the result of the back surface growth sample, cracks at the time of forming the back side semiconductor layer (step 2) could be stably suppressed. Meanwhile, in the nitride semiconductor template sample in which the width of the non-growth region of the back side semiconductor layer was inure than 5 mm, the warp reducing effect by the back side semiconductor layer could not be sufficiently obtained when the nitride semiconductor template was manufactured. In contrast, in the nitride semiconductor template sample in which the width of the non-growth region of the back side semiconductor layer was 5 mm or less, it was confirmed that the warp reducing effect by the back side semiconductor layer could be sufficiently obtained.

Regarding the width of the non-growth region of the front side semiconductor layer, in the nitride semiconductor template sample in which the width of the non-growth region of the front side semiconductor layer was less than 0.5 mm, although a certain effect of suppressing cracking of the nitride semiconductor template was observed, the crack suppressing effect was limited. In contrast, in the nitride semiconductor template sample in which the width of the non-growth region of the front side semiconductor layer was 0.5 mm or more (and 5 mm or less), it was confirmed that the nitride semiconductor template could be stably obtained, with the cracks suppressed. Accordingly, since the width of the region where the peripheral cover covers the front surface side of the substrate was 0.5 mm or more, it was confirmed that the crack of the nitride semiconductor template could be stably suppressed if the thickness of the front side semiconductor layer was large. Note that from a viewpoint of suppressing the cracks, it is considered that there is no upper limit value of the width of the non-growth region of the front side semiconductor layer (up to a radius of the substrate). However, if the width of the non-growth region of the front side semiconductor layer is too large, the area of the front side semiconductor layer which will be the growth underlayer becomes small and the productivity of the semiconductor device is lowered. From this viewpoint, it is considered that, the width of the non-growth region of the front side semiconductor layer is practically preferably 5 mm or less.

Note that even when the width of the region (non-growth region) where the peripheral cover covers the main surface of the substrate was different in a range of ±2 mm in each of the case of forming the back side semiconductor layer (step 2) and the case of forming the front side semiconductor layer (step 3), it was confirmed that there was no significant influence on the ratio of a breakage of the nitride semiconductor template and the warping amount of the nitride semiconductor template.

(Conclusion)

As described above, in samples 8 to 13, and 15 to 17, it was confirmed that a high-quality nitride semiconductor template could be obtained with high yield.

(3) Regarding the Nitride Semiconductor Free-Standing Substrate

Next a nitride semiconductor free-standing substrate was manufactured as follows, using the nitride semiconductor template sample 17 described above.

In step 4, a front side supporting substrate comprising an alumina substrate was attached to the front side semiconductor layer of the nitride semiconductor template interposing an adhesive layer composed of a double-sided tape. Next, the backside semiconductor layer and the substrate were removed by grinding and lapping. Next, a back side supporting substrate comprising a polycrystalline GaN substrate was attached to the back surface side of the front side semiconductor layer interposing an adhesive layer made of a ceramic adhesive. Next, the adhesive layer and the front side supporting substrate were removed from the front surface side of the front side semiconductor layer, and the surface of the front side semiconductor layer was cleaned using an organic cleaning solution. Thereby, a substrate for crystal growth substrate was obtained. The thickness of the front side semiconductor layer in the finally obtained crystal growth substrate was about 100 µm.

Next, in step 5, a full-scale growth layer comprising GaN was grown on the front side semiconductor layer of the crystal growth substrate, using the HVPE apparatus. At this time, the thickness of the full-scale growth layer was 2400 µm. Namely, a total thickness of the front side semiconductor layer and the full-scale growth layer was 2500 µm.

Next in step 6, the full-scale growth layer was sliced, using a wire saw. At this time, a width of the cutting margin by the wire saw was 200 µm, and a nitride semiconductor free-standing substrate with a thickness of 500 µm was obtained from the full-scale growth layer. As described above, the nitride semiconductor free-standing substrate was manufactured.

In the manufacturing step of the above-described nitride semiconductor free-standing substrate, there were no cracks generated in the full-scale growth layer, etc., when the full-sale growth layer was formed. Namely, it was confirmed that by removing the back side semiconductor layer and the substrate, from the nitride semiconductor template and leaving the front side semiconductor layer to thereby form a crystal growth substrate, a thick full-scale growth layer could be stably grown on the crystal growth substrate in a thermal stress-free state.

Further, the dislocation density in the above-described nitride semiconductor free-standing substrate was $0.3 \times 1.0^{-7}$ $cm^{-2}$. Namely, it was confirmed that by using a nitride semiconductor template in which the front side semiconductor layer was thickened and its dislocation density was lowered, the dislocation density of the full-scale growth layer grown on the front side semiconductor layer of the crystal growth substrate could also be lowered, and a high-quality nitride semiconductor free-standing substrate could be obtained from the full-scale growth layer.

<Preferable Aspects of the Present Invention>

Preferable aspects of the present invention will be described hereafter.

(Supplementary Description 1)

There is provided a nitride semiconductor template, including:

a substrate having a front surface and a back surface opposite to the front surface;

a back side semiconductor layer provided on a back surface side of the substrate, comprising a polycrystalline group lit nitride semiconductor, and having a linear expansion coefficient different from a linear expansion coefficient of the substrate; and a front side semiconductor layer provided on a front surface side of the substrate, comprising a monocrystalline group III nitride semiconductor, and having a linear expansion coefficient different from a linear expansion coefficient of the substrate, wherein a thickness of the front side semiconductor layer is a thickness exceeding a critical thickness at which cracks are generated in the front side semiconductor layer in a case that only the front side semiconductor layer is formed without forming the back side semiconductor layer, (Supplementary Description 2)

The nitride semiconductor template according to the supplementary description 1, wherein the critical thickness is a thickness at which cracks are generated in the front side semiconductor layer when a temperature of the nitride semiconductor template is raised to a growth temperature of the group III nitride semiconductor in a case that only the front side semiconductor layer is formed without forming the back side semiconductor layer.

(Supplementary Description 3)

The nitride semiconductor template according to the supplementary description 1, wherein the critical thickness is a thickness at which cracks are generated in the front side semiconductor layer after elapse of a predetermined time from formation of the front side semiconductor layer in a case that only the front side semiconductor layer is formed without forming the back side semiconductor layer.

(Supplementary description 4)

The nitride semiconductor template according to the supplementary description 1, wherein the critical thickness is a thickness at which cracks are generated in the front side semiconductor layer immediately after formation of the front side semiconductor layer in a case that only the front side semiconductor layer is formed without forming the back side semiconductor layer.

(Supplementary Description 5)

The nitride semiconductor template according to the supplementary description 1, wherein the thickness of the front side semiconductor layer is more than 20 μm.

(Supplementary Description 6)

The nitride semiconductor template according to the supplementary description 5, wherein the thickness of the front side semiconductor layer is 50 μm or more.

(Supplementary Description 7)

The nitride semiconductor template according to any one of the supplementary descriptions 1 to 6, wherein the ratio of the thickness of the back side semiconductor layer to the thickness of the front side semiconductor layer is 1.0 times or more and 1.5 times or less.

(Supplementary Description 8)

The nitride semiconductor template according to any one of the supplementary descriptions 1 to 7, wherein the thickness of the back side semiconductor layer is 50 μm or more.

(Supplementary Description 9)

A nitride semiconductor template, including:

a substrate having a front surface and a back surface opposite to the front surface;

a back side semiconductor layer provided on a back surface side of the substrate, comprising a polycrystalline group III nitride semiconductor, and having a linear expansion coefficient different from a linear expansion coefficient of the substrate; and a front side semiconductor layer provided on a front surface side of the substrate, comprising a monocrystalline group III nitride semiconductor, and baying a linear expansion coefficient different from a linear expansion coefficient of the substrate, wherein the thickness of the back side semiconductor layer is 50 μm or more.

(Supplementary Description 10)

The nitride semiconductor template according to any one of the supplementary descriptions 1 to 9, wherein a dislocation density on the front surface of the front side semiconductor layer is $5 \times 10^7$ cm$^{-2}$ or less.

(Supplementary Description 11)

The nitride semiconductor template according to the supplementary description 10, wherein the dislocation density on the front surface of the front side semiconductor layer is less than $1 \times 10^7$ cm$^{-2}$.

(Supplementary Description 12)

The nitride semiconductor template according to any one of the supplementary descriptions 1 to 11, wherein a surface roughness RMS on the front surface of the front side semiconductor layer is 2 nm or less in as-grown state.

(Supplementary Description 13)

The nitride semiconductor template according to any one of the supplementary descriptions 1 to 12, wherein a warping amount of the nitride semiconductor template is within ±200 μm at 25° C.

(Supplementary Description 14)

The nitride semiconductor template according to supplementary description 13, wherein the warping amount of the nitride semiconductor template is within ±200 μm over a range of at least 25° C. or more and 1000° C. or less.

(Supplementary Description 15)

The nitride semiconductor template according to any one of the supplementary descriptions 1 to 14, wherein the thickness of the back side semiconductor layer is equal to or more than the thickness of the front side semiconductor layer.

(Supplementary Description 16)

The nitride semiconductor template according to any one of the supplementary descriptions 1 to 15, wherein the ratio of the thickness of the back side semiconductor layer to the thickness of the front side semiconductor layer is 1.1 times or more and 1.5 times or less.

(Supplementary Description 17)

The nitride semiconductor template according to any one of the supplementary descriptions 1 to 16, wherein the back side semiconductor layer is provided directly on the back surface of the substrate, and the front side semiconductor layer is provided on the front surface side of the substrate interposing a buffer layer which enhances a crystal orientation of the front side semiconductor layer.

(Supplementary Description 18)

The nitride semiconductor template according to any one of the supplementary descriptions 1 to 17, wherein the front surface of the substrate is a mirror surface, and the back surface of the substrate is a mirror surface or a rough surface having random irregularities.

(Supplementary Description 19)

The nitride semiconductor template according to any one of the supplementary descriptions 1 to 17, wherein the front surface of the substrate has a plurality of recesses or protrusions provided periodically one-dimensionally or two-dimensionally, and the back surface of the substrate is a mirror surface or a rough surface having random irregularities.

(Supplementary Description 20)

The nitride semiconductor template according to any one of the supplementary descriptions 1 to 19, wherein the back side semiconductor layer is provided, with a space from a peripheral edge portion of the back surface side of the substrate.

(Supplementary Description 21)

The nitride semiconductor template according to the supplementary description 20, wherein the back side semiconductor layer is provided in a region excluding a region of 0.5 mm or more and 5 min or less from the peripheral edge portion of the back surface to a center side, on the back surface side of the substrate.

(Supplementary Description 22)

The nitride semiconductor template according to any one of the supplementary descriptions 1 to 21, wherein the front side semiconductor layer is provided, with a space from the peripheral edge portion of the front surface side of the substrate, (Supplementary Description 23)

The nitride semiconductor template according to the supplementary description 22, wherein the front side semiconductor layer is provided in a region excluding a region of 0.5 mm or more and 5 mm or less from the peripheral edge portion of the front surface to a center side, on the front surface side of the substrate.

(Supplementary Description 24)

The nitride semiconductor template according to any one of the supplementary descriptions 1 to 23, wherein the backside semiconductor layer is uniform in the back surface of the substrate.

(Supplementary Description 25)

The nitride semiconductor template according to any one of the supplementary descriptions 1 to 23, wherein a thickness on an outer peripheral side of the back side semiconductor layer is larger than a thickness on a center side of the back side semiconductor layer.

(Supplementary Description 26)

The nitride semiconductor template according to any one of the supplementary descriptions 1 to 23, wherein a thickness on an outer peripheral side of the back side semiconductor layer is smaller than a thickness on a center side of the back side semiconductor layer.

(Supplementary Description 27)

A method for manufacturing a nitride semiconductor template, including:
 a first step of preparing a substrate having a front surface and a back surface opposite to the front surface;
 a second step of forming a back side semiconductor layer provided on a back surface side of the substrate, comprising a polycrystalline or amorphous group III nitride semiconductor, and having a linear expansion coefficient different from a linear expansion coefficient of the substrate; and
 a third step of forming a front side semiconductor layer on the front surface side of the substrate, comprising a monocrystalline group III nitride semiconductor, and having a linear expansion coefficient different from a linear expansion coefficient of the substrate,
 wherein the third step is performed after the second step.

(Supplementary Description 28)

There is provided a method for manufacturing a nitride semiconductor template of the supplementary description 27, wherein in the third step, a thickness of the front side semiconductor layer is set to a thickness exceeding a critical thickness at which cracks are generated in the front side semiconductor layer when the second step is not performed.

(Supplementary Description 29)

There is provided the method for manufacturing a nitride semiconductor template of the supplementary description 28, wherein in the third step, the thickness of the front side semiconductor layer is set to more than 20 μm.

(Supplementary Description 30)

There is provided the method for manufacturing a nitride semiconductor template of the supplementary description 29, wherein in the third step, the thickness of the front side semiconductor layer is set to 50 μm or more.

(Supplementary Description 31)

There is provided the method for manufacturing a nitride semiconductor template of the supplementary description 29, wherein in the second step, the thickness of the back side semiconductor layer is set to 50 μm or more.

(Supplementary Description 32)

There is provided the method for manufacturing a nitride semiconductor template of any one of the supplementary descriptions 27 to 31, wherein in the second step, the back side semiconductor layer is directly formed on the back surface side of the substrate, and in the third step, the front side semiconductor layer is formed on the front surface side of the substrate interposing a buffer layer which enhances a crystal orientation of the front side semiconductor layer.

(Supplementary Description 33)

There is provided the method for manufacturing a nitride semiconductor template of any one of the supplementary descriptions 27 to 32, wherein in the second step, the back side semiconductor layer is formed only on the back surface side of the substrate, with the front surface side of the substrate protected.

(Supplementary Description 34)

There is provided the method for manufacturing a nitride semiconductor template of the supplementary description 33, wherein the second step is performed, with the substrate placed on a susceptor so that the front surface side of the substrate faces the susceptor, while interposing a ring-shaped spacer between the front surface of the substrate and the susceptor so as to surround a peripheral edge of the front surface of the substrate.

(Supplementary Description 35)

There is provided the method for manufacturing a nitride semiconductor template of the supplementary description 33, wherein the second step is performed, with the substrate placed on the susceptor, while using a plate-like spacer having a plate-like spacer bottom portion and a spacer protruding portion protruding from the spacer bottom portion so as to surround the peripheral edge of the front, surface of the substrate, making the spacer protruding portion brought into contact with the peripheral edge of the front surface of the substrate so that the front surface side of the substrate faces the spacer bottom portion, and interposing the plate-like spacer between the front surface of the substrate and the susceptor.

(Supplementary Description 36)

There is provided the method for manufacturing a nitride semiconductor template of any one of the supplementary descriptions 27 to 35, wherein a growth temperature of the back side semiconductor layer in the second step is made equal to a growth temperature of the front side semiconductor layer of the third step.

(Supplementary Description 37)

There is provided the method for manufacturing a nitride semiconductor template of any one of the supplementary descriptions 27 to 36, wherein in the second step, the back side semiconductor layer is formed, with a space from a peripheral edge portion of the back surface side of the substrate, by covering the peripheral edge of the back surface of the substrate.

(Supplementary Description 38)

There is provided the method for manufacturing a nitride semiconductor template of any one of the supplementary descriptions 27 to 37, wherein in the third step, the front side semiconductor layer is formed, with a space from a peripheral edge portion of the front surface side of the substrate, by covering the peripheral edge of the front surface of the substrate.

(Supplementary Description 39)

There is provided the method for manufacturing a nitride semiconductor template of any one of the supplementary descriptions 27 to 38, wherein a step of polishing a front surface of the front side semiconductor layer is not performed after the third step.

(Supplementary Description 40)

There is provided a method for manufacturing a nitride semiconductor free-standing substrate, including:
- a first step of preparing a substrate having a front surface and a back surface opposite to the front surface;
- a second step of forming a back side semiconductor layer provided on a back surface side of the substrate, comprising a polycrystalline or amorphous group III nitride semiconductor, and having a linear expansion coefficient different from a linear expansion coefficient of the substrate;
- a third step of forming a nitride semiconductor template by forming a front side semiconductor layer on the front surface side of the substrate, comprising a monocrystalline group III nitride semiconductor, and having a linear expansion coefficient different from a linear expansion coefficient of the substrate; and
- a fourth step of removing the back side semiconductor layer and the substrate from the nitride semiconductor template to leave the front side semiconductor layer, wherein the third step is performed after the second step.

What is claimed is:

1. A nitride semiconductor template, comprising:
   a substrate having a diameter of 2 inches or more and having a front surface and a back surface opposite to the front surface;
   a back side semiconductor layer provided on a back surface side of the substrate, comprising a polycrystalline group III nitride semiconductor, and having a linear expansion coefficient different from a linear expansion coefficient of the substrate; and
   a front side semiconductor layer provided on a front surface side of the substrate, comprising a monocrystalline group III nitride semiconductor, and having a linear expansion coefficient different from a linear expansion coefficient of the substrate,
   wherein surface roughness on the back surface of the substrate is larger than surface roughness on the front surface of the substrate,
   a thickness of the front side semiconductor layer is more than 20 μm,
   the front side semiconductor layer has no cracks, and
   root mean square roughness on a front surface of the front side semiconductor layer is 2 nm or less in as-grown state.

2. The nitride semiconductor template according to claim 1, wherein the thickness of the front side semiconductor layer is 50 μm or more.

3. The nitride semiconductor template according to claim 1, wherein the ratio of the thickness of the back side semiconductor layer to the thickness of the front side semiconductor layer is 1.0 times or more and 1.5 times or less.

4. The nitride semiconductor template according to claim 1, wherein the thickness of the back side semiconductor layer is 50 μm or more.

5. The nitride semiconductor template according to claim 1, wherein a dislocation density on a front surface of the front side semiconductor layer is $5 \times 10^7$ cm$^{-2}$ or less.

6. The nitride semiconductor template according to claim 5, wherein the dislocation density on a front surface of the front side semiconductor layer is less than $1 \times 10^7$ cm$^{-2}$.

7. The nitride semiconductor template according to claim 1 wherein a warping amount of the nitride semiconductor template is within ±200 μm at 25° C.

8. The nitride semiconductor template according to claim 7, wherein the warping amount of the nitride semiconductor template is within ±200 μm over a range of at least 25° C. or more and 1000° C. or less.

9. The nitride semiconductor template according to claim 1, wherein the thickness of the back side semiconductor layer is equal to or more than the thickness of the front side semiconductor layer.

10. The nitride semiconductor template according to claim 1, wherein the back side semiconductor layer is provided directly on the back surface of the substrate, and the front side semiconductor layer is provided on the front surface side of the substrate interposing a buffer layer which enhances a crystal orientation of the front side semiconductor layer.

11. The nitride semiconductor template according to claim 1, wherein the front surface of the substrate is a mirror surface, and the back surface of the substrate is a mirror surface or a rough surface having random irregularities.

12. The nitride semiconductor template according to claim 1, wherein the back side semiconductor layer is provided, with a space from a peripheral edge portion of the back surface side of the substrate.

13. The nitride semiconductor template according to claim 12, wherein the back side semiconductor layer is provided in a region excluding a region of 0.5 mm or more and 5 mm or less from the peripheral edge portion of the back surface toward a center side, on the back surface side of the substrate.

14. The nitride semiconductor template according to claim 1, wherein the front side semiconductor layer is provided, with a space from a peripheral edge portion of the front surface side of the substrate.

15. The nitride semiconductor template according to claim 14, wherein the front side semiconductor layer is provided in a region excluding a region of 0.5 mm or more and 5 mm or less from the peripheral edge portion of the front surface toward a center side, on the front surface side of the substrate.

16. The nitride semiconductor template according to claim 1, wherein the root mean square roughness on the front surface of the front side semiconductor layer is obtained by measuring a region having a 20 μm square using an atomic force microscope.

17. The nitride semiconductor template according to claim 1,
   wherein a transmittance of the nitride semiconductor template at a wavelength of 550 nm is less than 60%.

18. The nitride semiconductor template according to claim 1,
wherein a transmittance of the nitride semiconductor template at a wavelength of 2 μm is less than 60%.

19. The nitride semiconductor template according to claim 1,
wherein the front side semiconductor layer is formed after forming the back side semiconductor layer.

* * * * *

UNITED STATES PATENT AND TRADEMARK OFFICE
CERTIFICATE OF CORRECTION

PATENT NO. : 12,129,572 B2
APPLICATION NO. : 16/309535
DATED : October 29, 2024
INVENTOR(S) : Hajime Fujikura et al.

It is certified that error appears in the above-identified patent and that said Letters Patent is hereby corrected as shown below:

In the Specification

Column 3, Line 39, delete "layer is farmed on the" and insert --layer is formed on the--.

Column 3, Line 56, delete "warped in airily due to" and insert --warped mainly due to--.

Column 4, Line 36, delete "layer en the front, delete surface" and insert --layer on the front surface--.

Column 4, Line 62, delete "less which will described" and insert --less which will be described--.

Column 6, Line 62, delete "in the hack side" and insert --in the back side--.

Column 7, Line 66, delete "160 is inure than 20 μm." and insert --160 is more than 20 μm.--.

Column 11, Line 8, delete "roughness RIMS on the" and insert --roughness RMS on the--.

Column 15, Line 43, delete "gas and 112 gas into" and insert --gas and $H^2$ gas into--.

Column 21, Line 10, delete "stress of the hack side" and insert --stress of the back side--.

Column 22, Line 31, delete "roughness films on the front" and insert --roughness RMS on the front--.

Column 26, Line 39, delete "1 to 10 min than the" and insert --1 to 10 mm than the--.

Column 27, Line 3, delete "about 0.5 to 5 min)." and insert --about 0.5 to 5 mm).--.

Column 27, Line 16, delete "thickness of the hack side" and insert --thickness of the back side--.

Column 27, Line 28, delete "Specifically; for example," and insert --Specifically, for example,--.

Signed and Sealed this
Twenty-second Day of July, 2025

Coke Morgan Stewart
*Acting Director of the United States Patent and Trademark Office*

Column 27, Line 38, delete "not provided, in a nitride" and insert --not provided. In a nitride--.

Column 29, Line 28, delete "or a finlike substrate is used" and insert --or a mullite substrate is used--.

Column 29, Line 34, delete "adhesive layer 160 is solidified" and insert --adhesive layer 460 is solidified--.

Column 29, Line 35, delete "into close contact: with" and insert --into close contact with--.

Column 29, Line 43, delete "material if the adhesive" and insert --material of the adhesive--.

Column 31, Line 12, delete "modified example and" and insert --modified example 4, and--.

Column 31, Line 66, delete "substrate 100 may he a" and insert --substrate 100 may be a--.

Column 32, Line 56, delete "200, however, the film" and insert --200. However, the film--.

Column 32, Line 63, delete "step 2, however, if the" and insert --step 2. However, if the--.

Column 35, Line 18, delete "layer will be described in" and insert --layer will be described. In--.

Column 35, Line 20, delete "layer was 50 μm or less," and insert --layer was 60 μm or less,--.

Column 38, Line 11, delete "of the hack surface growth" and insert --of the back surface growth--.

Column 39, Line 10, delete "elapse of 21 hours after" and insert --elapse of 24 hours after--.

Column 40, Line 49, delete "the thickness of the hack" and insert --the thickness of the back--.

Column 40, Line 57, delete "cover will he described next." and insert --cover will be described next.--.

Column 41, Line 32, delete "the case of a thick Ma (when" and insert --the case of a thick film (when--.

Column 43, Line 4, delete "(non-growth region) where t" and insert --(non-growth region) where the --.

Column 43, Line 22, delete "layer was inure than 5 mm," and insert --layer was more than 5 mm,--.

Column 44, Line 51, delete "substrate was $0.3 \times 1.0^{-7} cm^{-2}$." and insert --substrate was $0.3 \times 10^{-7} cm^{-2}$.--.

Column 45, Line 3, delete "group lit nitride semiconductor," and insert --group III nitride semiconductor,--.

Column 47, Line 14, delete "or more and 5 min or less" and insert --or more and 5 mm or less--.